(12) United States Patent
Ho et al.

(10) Patent No.: US 9,117,879 B2
(45) Date of Patent: Aug. 25, 2015

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Cheng-Ying Ho, Chiayi County (TW); Wen-De Wang, Chiayi County (TW); Jen-Cheng Liu, Hsin-Chu (TW); Dun-Nian Yaung, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/244,719

(22) Filed: Apr. 3, 2014

(65) Prior Publication Data

US 2015/0187636 A1 Jul. 2, 2015

Related U.S. Application Data

(60) Provisional application No. 61/921,753, filed on Dec. 30, 2013.

(51) Int. Cl.
| | |
|---|---|
| H01L 21/02 | (2006.01) |
| H01L 21/762 | (2006.01) |
| H01L 23/522 | (2006.01) |
| H01L 23/00 | (2006.01) |

(52) U.S. Cl.
CPC ...... *H01L 21/76251* (2013.01); *H01L 23/5226* (2013.01); *H01L 24/06* (2013.01); *H01L 2224/033* (2013.01); *H01L 2224/0601* (2013.01); *H01L 2224/0605* (2013.01)

(58) Field of Classification Search
CPC ............. H01L 2924/00014; H01L 2924/00; H01L 2924/0002; H01L 2224/13111; H01L 2224/32225
See application file for complete search history.

(56) References Cited

U.S. PATENT DOCUMENTS

2011/0076831 A1* 3/2011 Chen .......................... 438/421

* cited by examiner

*Primary Examiner* — Tony Tran
(74) *Attorney, Agent, or Firm* — Chun-Ming Shih

(57) ABSTRACT

A semiconductor device includes a first semiconductor chip comprising a first metallic structure, a top surface, and a bottom surface, a second semiconductor chip comprising a second metallic structure, wherein the second semiconductor chip is bonded with the first semiconductor chip on the bottom surface, a conductive material connecting the first metallic structure and the second metallic structure, wherein a portion of the conductive material is inside the first semiconductor chip and the second semiconductor chip, and a dielectric layer disposed surrounding the portion of the conductive material.

15 Claims, 19 Drawing Sheets

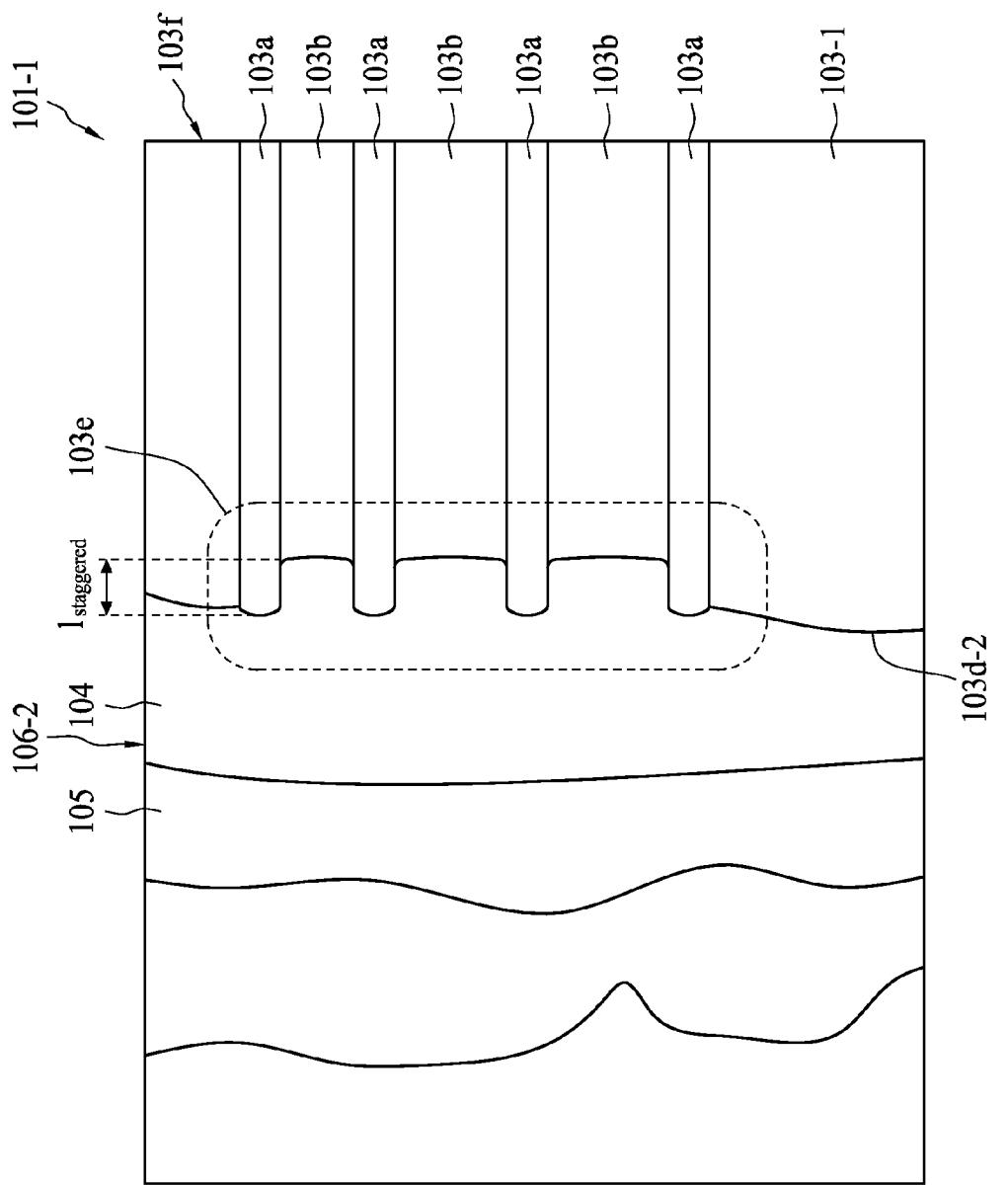

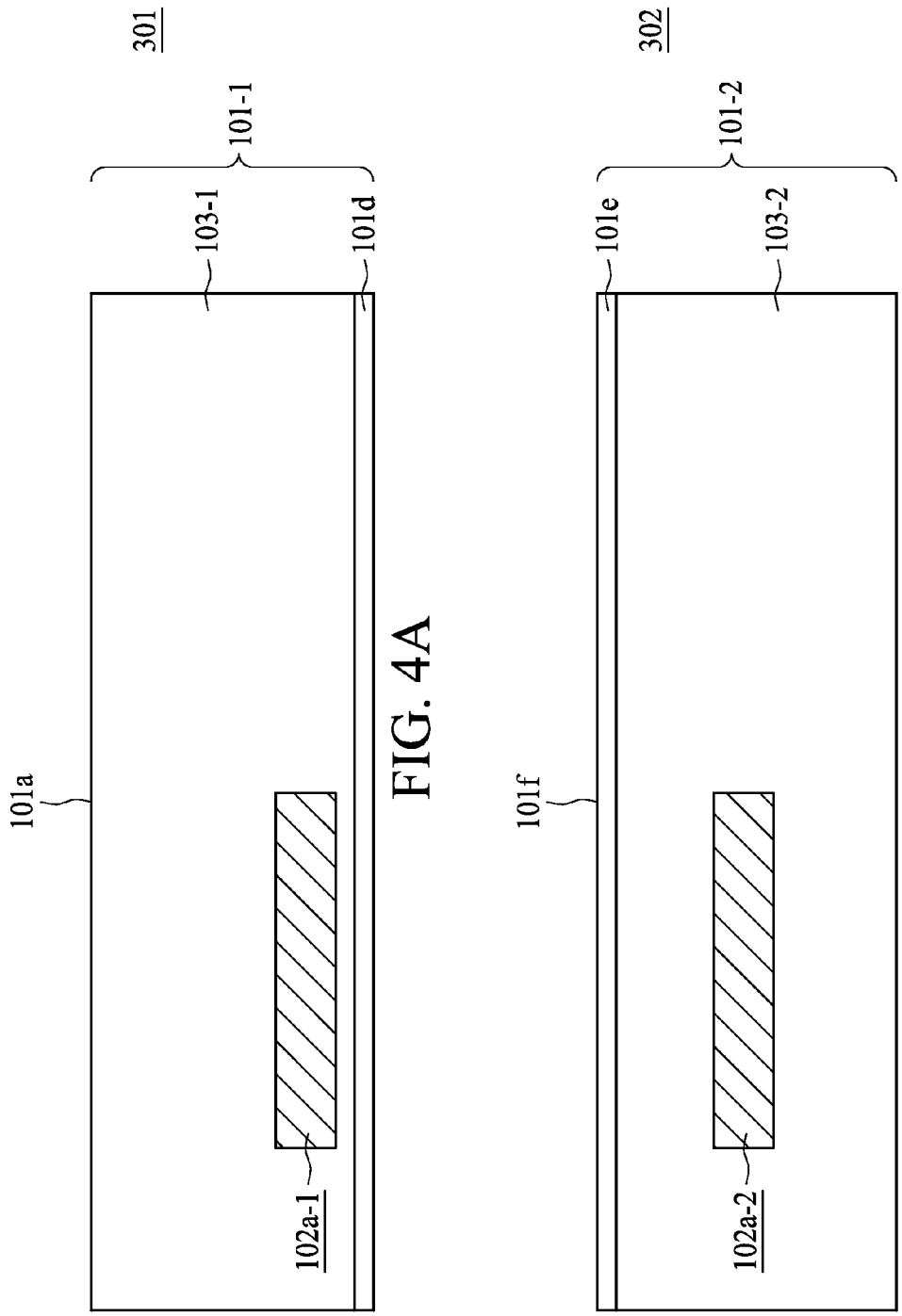

SEMICONDUCTOR DEVICE AND MANUFACTURING METHOD THEREOF

BACKGROUND

Electronic equipment using semiconductor devices are essential for many modern applications. With the advancement of electronic technology, electronic equipment is becoming increasingly smaller in size while having greater functionality and greater amounts of integrated circuitry. Thus, semiconductor devices inside the electronic equipment are also becoming denser, smaller and more compact. The continuous demands for a size reduction of semiconductor devices has made it necessary to develop more integrated circuits that can be accommodated within the semiconductor devices.

The major trend in the electronic industry is to make the semiconductor devices smaller and more multifunctional. Thus, a semiconductor device comprises an electrical interconnection structure for electrically connecting a number of metallic structures between adjacent layers of the semiconductor device so as to minimize the final size of the semiconductor device as well as the electronic equipment. The electrical interconnection structure includes a number of trenches or vias which are filled with a conductive material, such as copper or aluminum, and are pierced through several adjacent layers in the semiconductor device in order to connect circuits between adjacent layers.

However, manufacturing of the electrical interconnection structure is complicated because it involves numerous manufacturing operations and those operations are applied on the semiconductor device, which includes many different kinds of materials with different properties. The differences between the materials would increase the complexity of manufacturing the semiconductor devices and may cause deficiencies. Such deficiencies may include poor bondability between layers, poor reliability of the trenches, and cracking or delamination of the electrical interconnection structure. As such, there is a continuous need to improve the method for manufacturing the electrical interconnection structure so as to solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1A is a schematic view of a first insulating layer inside a first semiconductor chip in accordance with some embodiments of the present disclosure.

FIG. 4A is a schematic view of provision of a first semiconductor chip in accordance with some embodiments of the present disclosure.

FIG. 4B is a schematic view of provision of a second semiconductor chip in accordance with some embodiments of the present disclosure.

DETAILED DESCRIPTION OF THE DISCLOSURE

Figure 1:
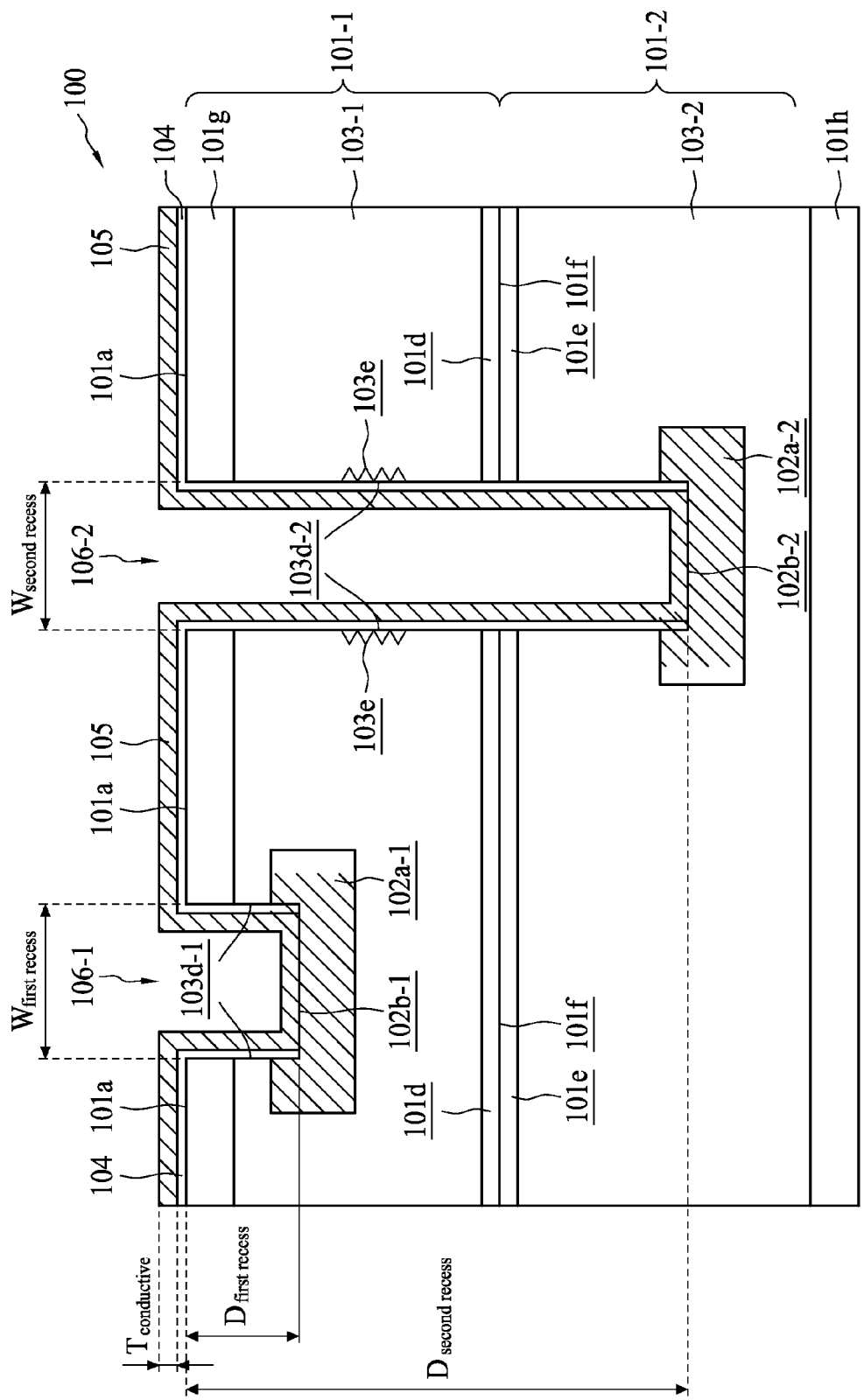
FIG. 1 is a schematic view of a semiconductor device including a first semiconductor chip and a second semiconductor chip in accordance with some embodiments of the present disclosure.

A semiconductor device is manufactured by a number of operations. During the manufacturing, an electrical interconnection structure is formed between a number of conductive metallic structures across a number of insulating layers of at least two semiconductor chips in the semiconductor device. The conductive metallic structures are connected with each other by piercing a number of trenches or vias from a semiconductor chip to another semiconductor chip. The trench is formed by etching through the semiconductor chips. The trench is then coated or filled with a conductive material, so that the conductive metallic structures are electrically connected across the semiconductor chips through the trench coated or filled with the conductive material.

However, the insulating layers of a semiconductor chip include various kinds of materials such as silicon oxide, black diamond (Black Diamond® (Applied Materials of Santa Clara, Calif.)) and silicon carbide etc. which have different etch rates to a predetermined etchant. As such, a lateral etching of sidewall of the trench is suffered. The lateral etching leads to an uneven and rough sidewall surface and thus induces a poor reliability upon disposition of the conductive material on the sidewall of the trench.

The manufacturing and use of the embodiments of the present disclosure are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

In the present disclosure, a semiconductor device with an improved electrical interconnection structure is disclosed. The electrical interconnection structure includes a recessed portion which is coated with an oxide layer in order to improve a smoothness of a sidewall surface of the recessed portion and thus prevent the poor reliability of the electrical interconnection structure and yield loss of the semiconductor device.

FIG. 1 is a diagram of a semiconductor device 100 in accordance with various embodiments of the present disclosure. The semiconductor device 100 includes a first semiconductor chip 101-1. The first semiconductor chip 101-1 includes a first substrate 101g, a first insulating layer 103-1 and a first metallic structure 102a-1 disposed within the first insulating layer 103-1.

In some embodiments, the first semiconductor chip 101-1 is a semiconductor sensor chip. In some embodiments, the first semiconductor chip 101-1 is fabricated by a complementary metal-oxide-semiconductor (CMOS) process techniques known in the art to become a CMOS image sensor (CIS) chip. The CIS chip is widely used in a digital camera application. The CIS chip is configured for capturing a light and converting the light into an electrical signal.

In some embodiments, the first semiconductor chip 101-1 comprises an epitaxial (EPI) layer (not shown) over a silicon substrate, and the silicon substrate is removed during a backside thinning operation until the EPI layer is exposed. In some embodiments, a portion of the EPI is remained. In some embodiments, a p-type photo active region and an n-type photo active region (not shown respectively) are formed in the remaining epitaxial layer.

In some embodiments, the first semiconductor chip 101-1 includes a transistor (not shown) which generates a signal related to an intensity or a brightness of a light projected on the photo active regions. In some embodiments, the transistor may be a transfer transistor. However, the transistor may be an example of the many types of functional transistors utilized within the first semiconductor chip 101-1. In some embodiments, the transistor may include other transistors such as a reset transistor, a source follower transistor or a select transistor. All suitable transistors and configurations utilized in the first semiconductor chip 101-1 are fully intended to be included within the scope of the embodiments.

In some embodiments, the first substrate 101g of the first semiconductor chip 101-1 includes silicon, germanium, gallium, arsenic, and combinations thereof. In some embodiments, the first substrate 101g is in a form of silicon-on-insulator (SOI) including a layer of a semiconductor material (e.g., silicon, germanium and/or the like) formed over an insulator layer (e.g., buried oxide and/or the like). In some embodiments, the first substrate 101g includes multi-layered substrates, gradient substrates, hybrid orientation substrates, any combinations thereof and/or the like.

In some embodiments, the first substrate 101g comprises a variety of electrical circuits (not shown) formed on the first substrate 102. In some embodiments, the electrical circuits is any one type of circuitries suitable for a particular application. In some embodiments, the electrical circuits includes various n-type metal-oxide semiconductor (NMOS) and/or p-type metal-oxide semiconductor (PMOS) devices such as transistors, capacitors, resistors, diodes, photo-diodes, fuses and/or the like. In some embodiments, the electrical circuits may be interconnected to perform one or more functions including memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

In some embodiments, the first insulating layer 103-1 is an inter-metal dielectric (IMD) layer including a dielectric material for isolating a number of conductive metallic structures from each other inside the first insulating layer 103-1. In some embodiments, the first insulating layer 103-1 includes at least two adjacent layers differing in etch rates to a predetermined etchant. In some embodiments, the at least two adjacent layers have difference in materials with different etch rates around 700 nm/min to a predetermined etchant CF4 gas. The layers are removed in different rates under the predetermined etchant upon the etching operation. In some embodiments, the at least two adjacent layers include a silicon oxide layer, silicon carbide layer and a black diamond (Black Diamond® (Applied Materials of Santa Clara, Calif.) layer, which have different etch rates from each other.

In some embodiments, the first metallic structure 102a-1 of the first semiconductor chip 101-1 is disposed within the first insulating layer 103-1. The first insulating layer 103-1 encapsulates the first metallic structure 102a-1. In some embodiments, the first metallic structure 102a-1 includes gold, silver, copper, nickel, tungsten, aluminum, palladium and/or alloys thereof. In some embodiments, the first metallic structure 102a-1 is a portion of a first metal interconnection of the first semiconductor chip 101-1.

In some embodiments, the semiconductor device 100 includes a second semiconductor chip 101-2. In some embodiments, the first semiconductor chip 101-1 is bonded with the second semiconductor chip 101-2. In some embodiments, the first semiconductor chip 101-1 and the second semiconductor chip 101-2 are bonded together through any suitable bonding techniques such as direct bonding. In some embodiments, the first semiconductor chip 101-1 is bonded by an interface 101f between the first semiconductor chip 101-1 and the second semiconductor chip 101-2. In some embodiments, the first semiconductor chip 101-1 and the second semiconductor chip 101-2 are bonded together by a metal-to-metal bonding (e.g., copper-to-copper bonding), dielectric-to-dielectric bonding (e.g., oxide-to-oxide bonding), metal-to-dielectric bonding (e.g., oxide-to-copper bonding), any combinations thereof and/or the like.

In some embodiments, the interface 101f is between a passivation layer 101d of the first semiconductor chip 101-1 and a passivation layer 101e of the second semiconductor chip 101-2. In some embodiments, the passivation layer 101d and the passivation layer 101e are respectively an oxide layer including silicon oxide. In some embodiments, the passivation layer 101d and the passivation layer 101e respectively includes silicon nitride. In some embodiments, the passivation layer 101d and the passivation layer 101e respectively includes a composite structure, hybrid bond, bonding interface including metal such as copper, and dielectric such as silicon oxide or silicon nitride.

In some embodiments, the second semiconductor chip 101-2 is a semiconductor application specific integrated circuit (ASIC) chip which is configured for a particular application. In some embodiments, the second semiconductor chip 101-2 includes several logic circuits such as an analog-to-digital converter, a data processing circuit, a memory circuit, a bias circuit, a reference circuit, any combinations thereof and/or the like.

In some embodiments, the second semiconductor chip 101-2 includes a second substrate 101h, a second insulating layer 103-2 and a second metallic structure 102a-2. In some embodiments, the second substrate 101h includes silicon, germanium, gallium, arsenic, and combinations thereof. In some embodiments, the second substrate 101h is in a form of silicon-on-insulator (SOI). In some embodiments, the second substrate 101h is multi-layered substrates, gradient substrates, hybrid orientation substrates, any combinations thereof and/or the like.

In some embodiments, the second substrate 101h includes a variety of electrical circuits (not shown). The electrical circuits formed on the second substrate 101h are configured for a particular application. In some embodiments, the electrical circuits may be interconnected to perform one or more functions such as memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

In some embodiments, the second insulating layer 103-2 is an inter-metal dielectric (IMD) layer including a dielectric material for isolating a number of conductive metallic structures from each other inside the second insulating layer 103-2. In some embodiments, the second insulating layer 103-2 includes various dielectric materials commonly used in integrated circuit fabrication. In some embodiments, the second insulating layer 103-2 includes silicon dioxide, silicon nitride or a doped glass layer such as boron silicate glass and the like. In some embodiments, the second insulating layer 103-2 is formed using suitable techniques such as sputtering, oxidation, CVD and/or the like.

In some embodiments, the second metallic structure 102a-2 of the second semiconductor chip 101-2 is disposed within the second insulating layer 103-2. The second insulating layer 103-2 encapsulates the second metallic structure 102a-2. In some embodiments, the second metallic structure 102a-2 includes gold, silver, copper, nickel, tungsten, aluminum, palladium and/or alloys thereof. In some embodiments, the second metallic structure 102a-2 is a portion of a first metal interconnection of the second semiconductor chip 101-2.

In some embodiments, the first semiconductor chip 101-1 includes a top surface 101a. The top surface 101a includes a first recessed portion 106-1 and a second recessed portion 106-2. In some embodiments, the first recessed portion 106-1 includes a first sidewall 103d-1 along the first recessed portion 106-1. In some embodiments, the top surface 101a includes a first recessed portion 106-1 extended from the top surface 101a to the first metallic structure 102a-1. In some embodiments, the first recessed portion 106-1 is extended from the top surface 101a to a portion 102b-1 of the first metallic structure 102a-1 disposed on or within the first metallic structure 102a-1. In some embodiments, the portion 102b-1 of the first metallic structure 102a-1 is coplanar with a bottom surface of the first recessed portion 106-1. In some embodiments, the first recessed portion 106-1 is configured in a cylindrical shape with a circular cross-section.

In some embodiments, the first metallic structure 102a-1 includes suitable metallic materials such as copper, which is of a different etching rate (selectivity) from the first substrate 101g and the first insulating layer 103-1. As such, the first metallic structure 102a-1 is functioned as a hard mask layer for an etching operation of the first insulating layer 103-1. In some embodiments, a selective etching operation is employed to etch the first insulating layer 103-1 rapidly, while a portion 102b-1 of the first metallic structure 102a-1 is partially etched away, thereby forming the first recessed portion 106-1 and forming the bottom surface of the first recessed portion 106-1 on or within the first metallic structure 102a-1. The depth of the first recessed portion 106-1 varies depending on different applications and design needs.

In some embodiments, the first recessed portion 106-1 includes a depth $D_{first\ recess}$ from the top surface 101a of the first semiconductor chip 101 to the portion 102b-1 of the first metallic structure 102a-1. In some embodiments, the depth $D_{first\ recess}$ of the first recessed portion 106-1 is about 1 um to about 5 um.

In some embodiments, the first recessed portion 106-1 includes a width $W_{first\ recess}$ between the first sidewall 103d-1. In some embodiments, the width $W_{first\ recess}$ of the first recessed portion 106-1 is about 5 um to about 12 um.

In some embodiments, the second recessed portion 106-2 is extended from the top surface 101a towards the second metallic structure 102a-2. In some embodiments, the second recessed portion 106-2 passes through the first semiconductor chip 101-1 and the second semiconductor chip 101-2. In some embodiments, the second recessed portion 106-2 includes a second sidewall 103d-2 surrounded by the at least two adjacent layers of the first insulting layer 103-1 with different materials. In some embodiments, the portion 102b-2 of the second metallic structure 102a-2 is coplanar with a bottom surface of the second recessed portion 106-2. In some embodiments, the second recessed portion 106-2 is configured in a cylindrical shape with a circular cross-section.

In some embodiments, the second metallic structure 102a-2 includes suitable metallic materials such as copper, which is of a different etching rate (selectivity) from the second substrate 101h and the second insulating layer 103-2. As such, the second metallic structure 102a-2 is functioned as a hard mask layer for an etching operation of the second insulating layer 103-2. In some embodiments, a selective etching operation is employed to etch the second insulating layer 103-2 rapidly, while a portion 102b-2 of the second metallic structure 102a-2 is partially etched away, thereby forming the second recessed portion 106-2 and forming the bottom surface of the second recessed portion 106-2 on or within the second metallic structure 102a-2. The depth of the second recessed portion 106-2 varies depending on different applications and design needs.

In some embodiments, the second recessed portion 106-2 includes a depth $D_{second\ recess}$ from the top surface 101a of the first semiconductor chip 101 to the portion 102b-2 of the second metallic structure 102a-2. In some embodiments, the depth $D_{second\ recess}$ of the second recessed portion 106-2 is about 6 um to about 12 um.

In some embodiments, the second recessed portion 106-2 includes a width $W_{second\ recess}$ between the second sidewall 103d-2. In some embodiments, the width $W_{second\ recess}$ of the second recessed portion 106-2 is about 5 um to about 12 um.

In some embodiments, the second recessed portion 106-2 includes a number of staggered portions 103e on a second sidewall 103d-2 of the second recessed portion 106-2 surrounded by the first insulating layer 103-1. As the first insulating layer 103-1 includes various kinds of materials with different etch rates, the number of staggered portions 103e are disposed on the second sidewall 103d-2 along the second recessed portion 106-2.

FIG. 1A is an enlarged view of an embodiment of the staggered portions 103e of the second recessed portion 106-2 in accordance with various embodiments of the present disclosure. In some embodiments, the staggered portions 103e are surrounded by the first insulating layer 103-1 of the first semiconductor chip 101-1. In some embodiments, the first insulating layer 103-1 includes a silicon carbide layer 103a and a black diamond layer 103b which are spaced in an interval. In some embodiments, the second recessed portion 106-2 is formed by etching some of the silicon carbide layer 103a and some of the black diamond layer 103b. The etch rate of the black diamond layer 103b is faster than the etch rate of the silicon carbide layer 103a 700 nm/min to a predetermined etchant CF4.

As the difference in the etch rates of the silicon carbide layer 103a and the black diamond layer 103b, the second sidewall 103d-2 of the first insulating layer 103-1 includes the number of staggered portions 103e along the second sidewall 103d-2 of the second recessed portion 106-2. In some embodiments, the black diamond layer 103b is recessed laterally relative to the silicon carbide layer 103a with a depth which is a length $l_{staggered}$ as shown in FIG. 1A. In some embodiments, the staggered portions 103e surrounded by the black diamond layer 103b is laterally indented towards an exterior 103f of the first insulating layer 103-1. The staggered portion 103e surrounded by the silicon carbide layer 103a is laterally protruded towards the second recessed portion 106-2. In some embodiments, the silicon carbide layer 103a protruded from the black diamond layer 103b is in the length $l_{staggered}$ about 46 nm to about 76 nm. In some embodiments, the length $l_{staggered}$ is about 40 nm to about 80 nm.

Referring back to FIG. 1, in some embodiments, a dielectric layer 104 is disposed on the top surface 101a of the first semiconductor chip 101-1, the first sidewall 103d-1 of the first recessed portion 106-1 and the second sidewall 103d-2 of the second recessed portion 106-2. In some embodiments, some portions of the dielectric layer 104 are disposed within the staggered portions 103e. In some embodiments, the portion 102b-1 of the first metallic structure 102a-1 and the portion 102b-2 of the second metallic structure 102a-2 are not covered by the dielectric layer 104. In some embodiments, the dielectric layer 104 is an oxide layer which includes a plasma enhanced oxide (PEOX). In some embodiments, the dielectric layer 104 includes a non-conductive material such as silicon dioxide. In some embodiments, the dielectric layer 104 is formed using suitable techniques such as sputtering, oxidation or etc.

Figure 2:
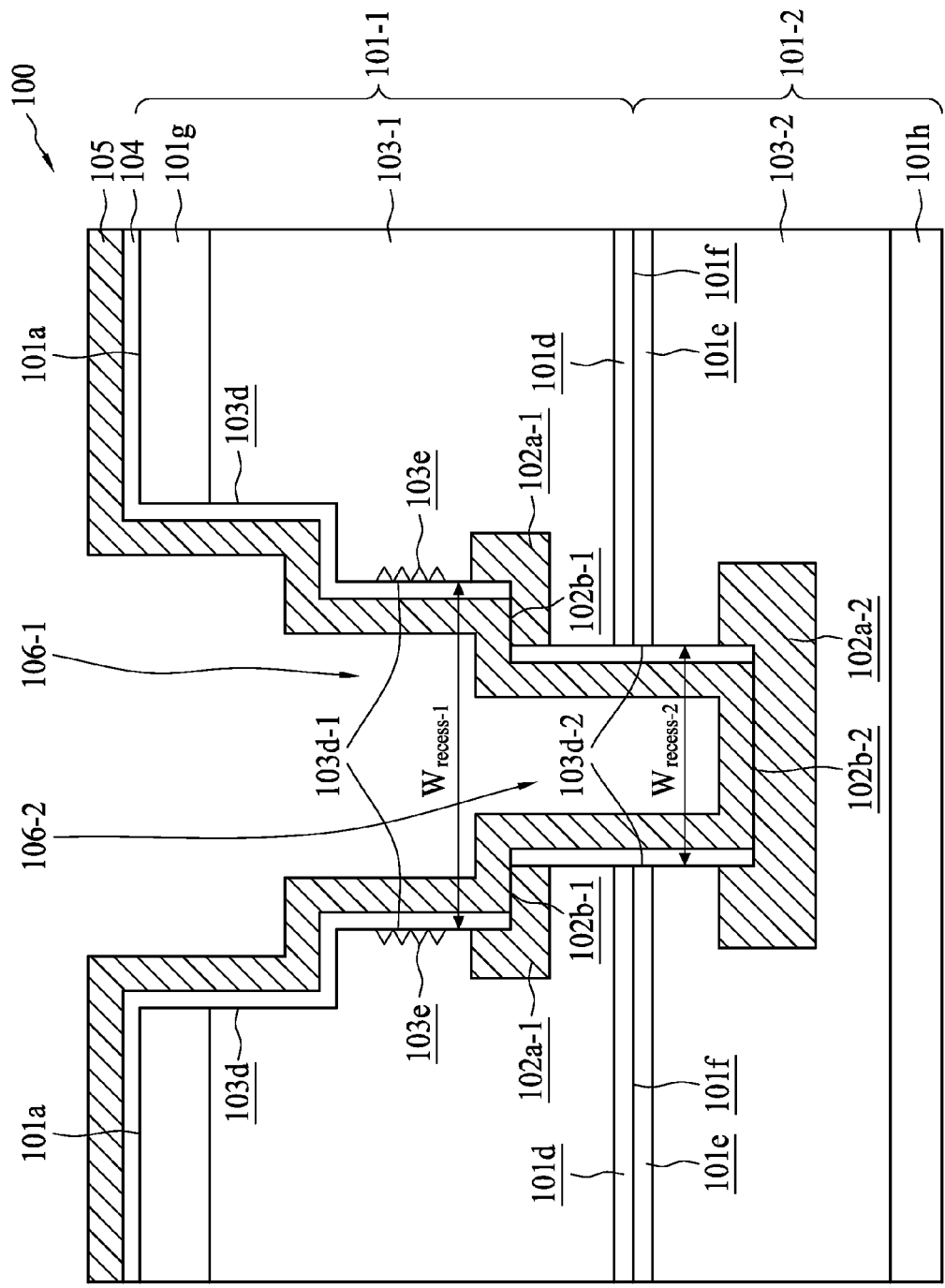
FIG. 2 is a schematic view of a semiconductor device including a first recessed portion and a second recessed portion in a stepped configuration in accordance with some embodiments of the present disclosure.

In some embodiments, a conductive material 105 covers the dielectric layer 104, the portion 102b-1 of the first metallic structure 102a-1 in the first semiconductor chip 101-1 and the portion 102b-2 of the second metallic structure 102a-2 in the second semiconductor chip 101-2. In some embodiments, the first metallic structure 102a-1 of the first semiconductor chip 101-1 is configured for electrically connecting with the second metallic structure 102a-2 in the second semiconductor chip 101-2. As such, the first metallic structure 102a-1 is electrically connected with the second metallic structure 102a-2 along the conductive material 105. In some embodiments, the conductive material 105 is coated on the dielectric layer 104, the portion 102b-1 of the first metallic structure 102a-1 and the portion 102b-2 of the second metallic structure 102a-2 by electroplating or sputtering or etc. The conductive material 105 is a metallic coating including gold, silver, copper, nickel, tungsten, aluminum, palladium and/or alloys thereof. In some embodiments, a thickness $T_{conductive}$ of the conductive material 105 is about 4 kA to 12 kA. In some embodiments, the thickness FIG. 2 is a diagram of a semiconductor device 100 in accordance with various embodiments of the present disclosure. In some embodiments, the semiconductor device 100 includes a first semiconductor chip 101-1 and a second semiconductor chip 101-2. The first semiconductor chip 101-1 includes a top surface 101a, a first insulating layer 103-1 and a first metallic structure 102a-1. The second semiconductor chip 101-2 includes a second insulating layer 103-2 and a second metallic structure 102a-2.

In some embodiments, the first semiconductor chip 101-1 is a CMOS image sensor chip, and the second semiconductor chip 101-2 is an ASIC chip. The first semiconductor chip 101-1 is bonded with the second semiconductor chip 101-2 by the interface 101f between the first semiconductor chip 101-1 and the second semiconductor chip 101-2. In some embodiments, the first semiconductor chip 101-1 includes the first metallic structure 102a-1 for electrically connecting with the second metallic structure 102a-2 in the second semiconductor chip 101-2. The first semiconductor chip 101-1 includes the first insulating layer 103-1 including at least two adjacent layers differing in etch rates to a predetermined etchant.

In some embodiments, the first semiconductor chip 101-1 includes a top surface 101a. The top surface 101a includes a first recessed portion 106-1. The first recessed portion 106-1 extends from the top surface 101a to a portion 102b-1 of the first metallic structure 102a-1. In some embodiments, the first recessed portion 106-1 includes a first sidewall 103d-1 along the first recessed portion 106-1 and a bottom surface disposed on or within the first metallic structure 102a-1.

In some embodiments, the first metallic structure 102a-1 includes suitable metallic materials such as copper, which is of a different etching rate (selectivity) from the first substrate 101g and the first insulating layer 103-1. As such, the first metallic structure 102a-1 is functioned as a hard mask layer for an etching operation of the first insulating layer 103-1. In some embodiments, a selective etching operation is employed to etch the first insulating layer 103-1 rapidly, while a portion 102b-1 of the first metallic structure 102a-1 is partially etched away, thereby forming the first recessed portion 106-1 with a first sidewall 103d-1. The depth of the first recessed portion 106-1 varies depending on different applications and design needs.

In some embodiments, a second recessed portion 106-2 extends from the portion 102b-1 of the first metallic structure 102a-1 to a portion 102b-2 of the second metallic structure. In some embodiments, the second recessed portion 106-2 includes a second sidewall 103d-2 along the second recessed portion 106-2 and a bottom surface disposed on or within the second metallic structure 102a-2. The second recessed portion 106-2 passes through the first semiconductor chip 101-1 and the second semiconductor chip 101-2.

In some embodiments, the second metallic structure 102a-2 includes suitable metallic materials such as copper, which is of a different etching rate (selectivity) from the second substrate 101h and the second insulating layer 103-2. As such, the second metallic structure 102a-2 is functioned as a hard mask layer for an etching operation of the second insulating layer 103-2. In some embodiments, a selective etching operation is employed to etch the second insulating layer 103-2 rapidly, while a portion 102b-2 of the second metallic structure 102a-2 is partially etched away, thereby forming the second recessed portion 106-2 with a second sidewall 103d-2 and forming the bottom surface of the second recessed portion 106-2 on or within the second metallic structure 102a-2. The depth of the second recessed portion 106-2 varies depending on different applications and design needs.

In some embodiments, the first recessed portion 106-1 and the second recessed portion 106-2 are in a stepped configuration. The first sidewall 103d-1 and the second sidewall 103d-2 are in a number of steps from the top surface 101a of the first semiconductor chip 101-1 towards the second metallic structure 102a-2. In some embodiments, a first width $w_{recess-1}$ of the first recessed portion 106-1 is larger than a second width $w_{recess-2}$ of the second recessed portion 106-2.

In some embodiments, the first sidewall 103d-1 surrounded by the first insulating layer 103-1 of the first semiconductor chip 101-1 includes a number of staggered portions 103e. As the first insulating layer 103-1 includes various kinds of materials with different etch rates, the number of staggered portions 103e are disposed on the first sidewall 103d-1 along the first recessed portion 106-1 surrounded by the first insulating layer 103-1.

In some embodiments, the top surface 101a of the first semiconductor chip 101-1, the first sidewall 103d-1 of the first recessed portion 106-1 and the second sidewall 103d-2 of the second recessed portion 106-2 are covered by a dielectric layer 104. In some embodiments, the portion 102b-1 of the first metallic structure 102a-1 and the portion 102b-2 of the second metallic structure 102a-2 are not covered by the dielectric layer 104. In some embodiments, some portions of the dielectric layer 104 are disposed within the number of staggered portions 103e. In some embodiments, the dielectric layer 104 is a non-conductive coating which is in a stepped configuration compliance with a profile of the first recessed portion 106-1 and the second recessed portion 106-2.

In some embodiments, the dielectric layer 104, the portion 102b-1 of the first metallic structure 102a-1 in the first semiconductor chip 101-1 and the portion 102b-2 of the second metallic structure 102a-2 in the second semiconductor chip 101-2 are covered by a conductive material 105, so that the first metallic structure 102a-1 is electrically connected with the second metallic structure 102a-2. In some embodiments, the conductive material 105 is a metal coating which is in a stepped configuration conformal over the dielectric layer 104, the portion 102b-1 and the portion 102b-2.

Figure 2A:
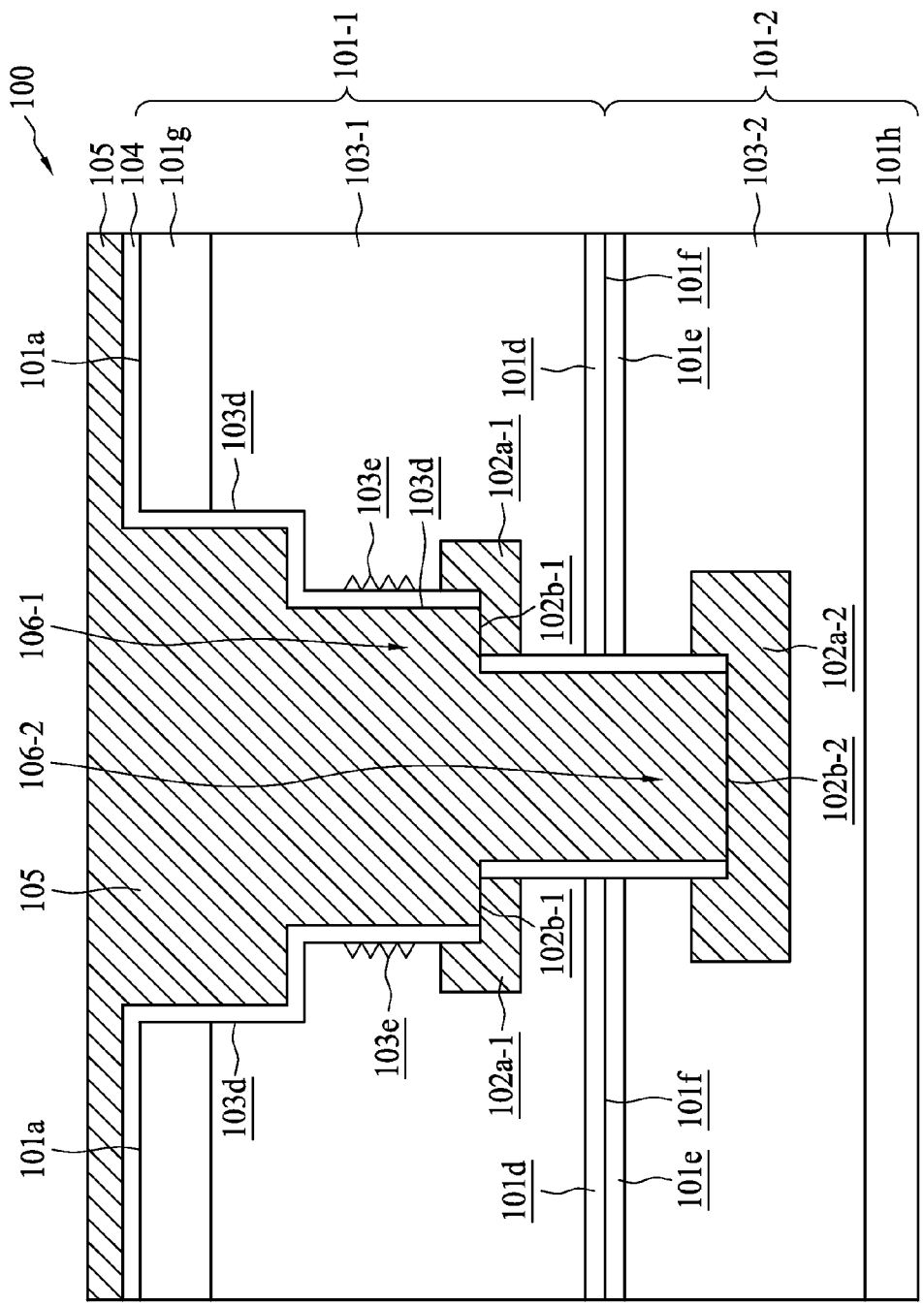
FIG. 2A is a schematic view a semiconductor device including a first semiconductor chip, a second semiconductor chip and a metal plug in accordance with some embodiments of the present disclosure.

In some embodiments, the conductive material 105 is a metal plug disposing and filling the first recessed portion 106-1 and the second recessed portion 106-2 in a stepped configuration as in FIG. 2A. In some embodiments, the metal plug is disposed on the dielectric layer 104, the portion 102b-1 of the first metallic structure 102a-1 and the portion 102b-2 of the second metallic structure 102a-2 by electroplating. In some embodiments, the metal plug includes gold, silver, copper, nickel, tungsten, aluminum, palladium and/or alloys thereof.

In the present disclosure, a method of manufacturing a semiconductor device is also disclosed. In some embodiments, a semiconductor device is formed by a method 200 or a method 300. The method 200 or the method 300 includes a number of operations and the description and illustration are not deemed as a limitation as the sequence of the operations.

Figure 3:
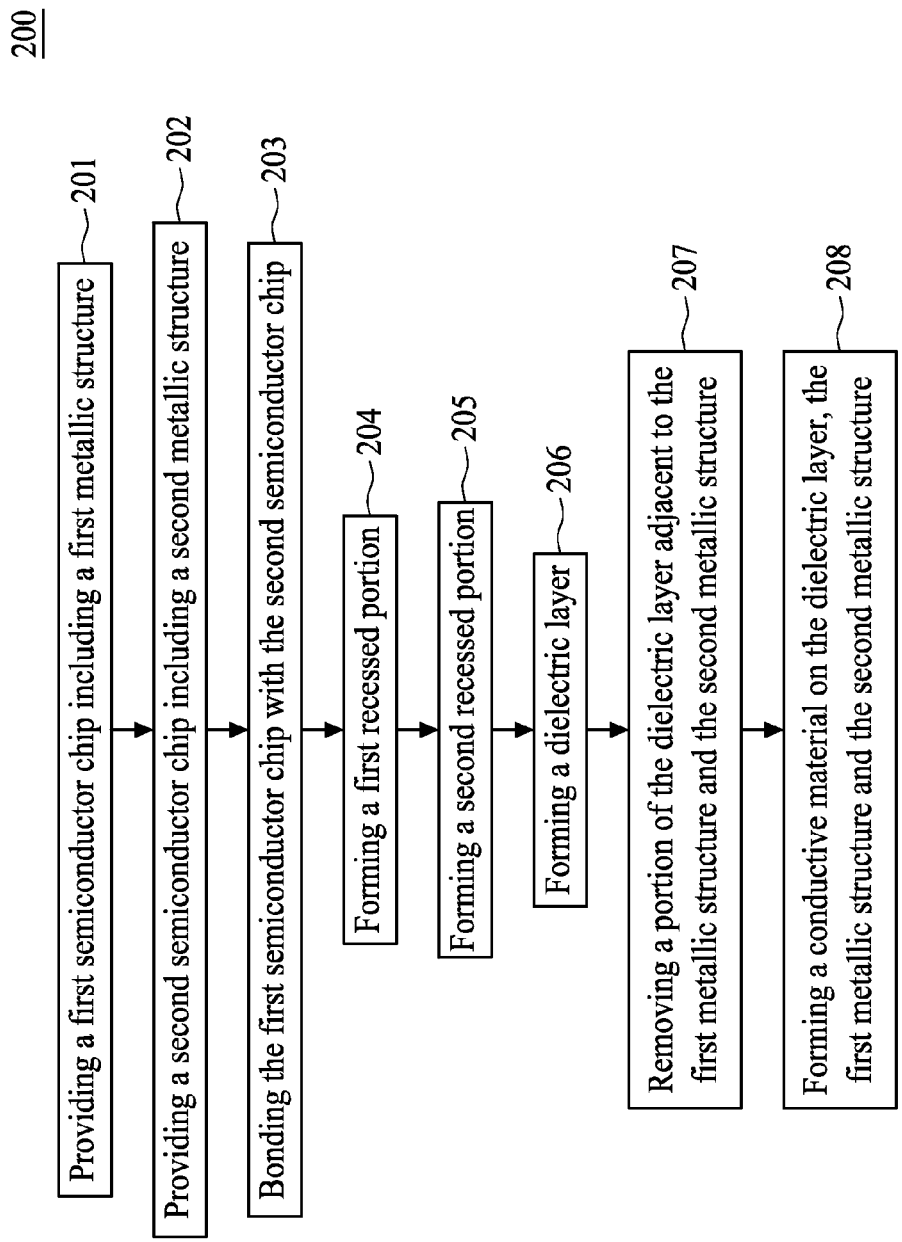
FIG. 3 is a flow diagram of a method of manufacturing a semiconductor device in accordance with some embodiments of the present disclosure.

FIG. 3 is a flowchart of a method 200 of manufacturing a semiconductor device. The method 200 includes a number of operations (201, 202, 203, 204, 205, 206, 207 and 208).

Figure 3A:
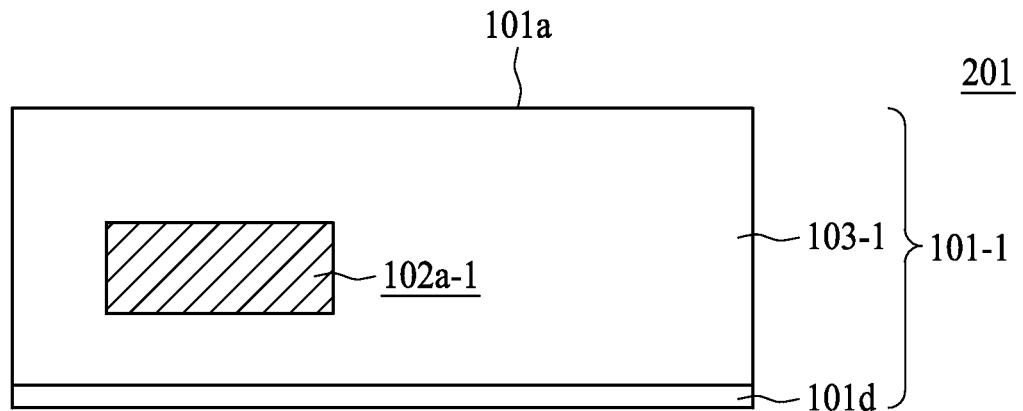
FIG. 3A is a schematic view of provision of a first semiconductor chip in accordance with some embodiments of the present disclosure.

In operation 201, a first semiconductor chip 101-1 is provided as in FIG. 3A. The first semiconductor chip 101-1 includes a first metallic structure 102a-1 inside the first semiconductor chip 101-1 and a top surface 101a. In some embodiments, the first semiconductor chip 101-1 includes a first insulating layer 103-1 including a various kinds of materials with different etch rates such as silicon carbide, black diamond, etc.

In some embodiments, the first semiconductor chip 101-1 includes a passivation layer 101d which is disposed opposite to the top surface 101a of the first semiconductor chip 101-1. In some embodiments, the first semiconductor chip 101-1 is fabricated by a complementary metal-oxide-semiconductor (CMOS) process techniques known in the art to become a CMOS image sensor (CIS) chip.

Figure 3B:
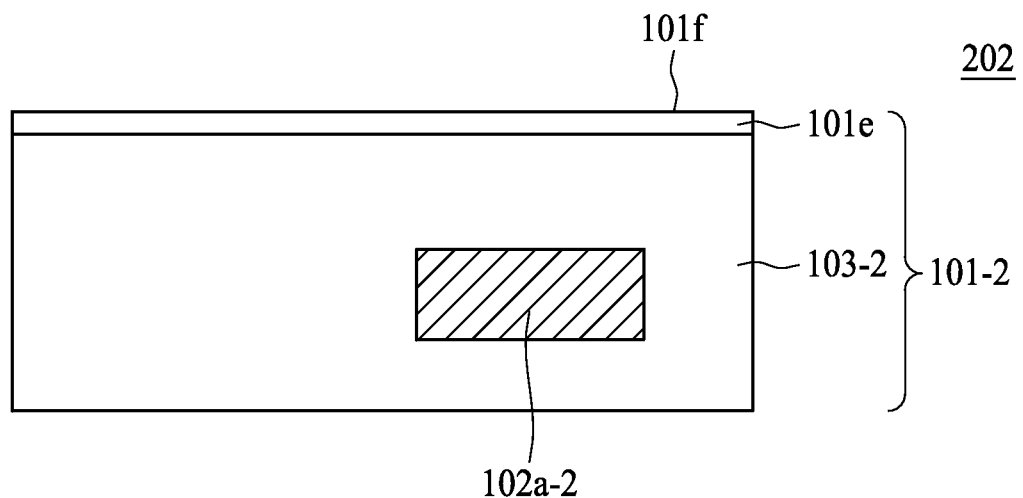
FIG. 3B is a schematic view of provision of a second semiconductor chip in accordance with some embodiments of the present disclosure.

In operation 202, a second semiconductor chip 101-2 is provided as in FIG. 3B. In some embodiments, the second semiconductor chip 101-2 is an ASIC chip. In some embodiments, the second semiconductor chip 101-2 includes a second metallic structure 102a-2 inside the second semiconductor chip 101-2. The second semiconductor chip 101-2 includes a second insulating layer 103-2 and a passivation layer 101e. The passivation layer 101e is adjacent to an interface 101f for bonding with the first semiconductor chip 101-1.

Figure 3C:
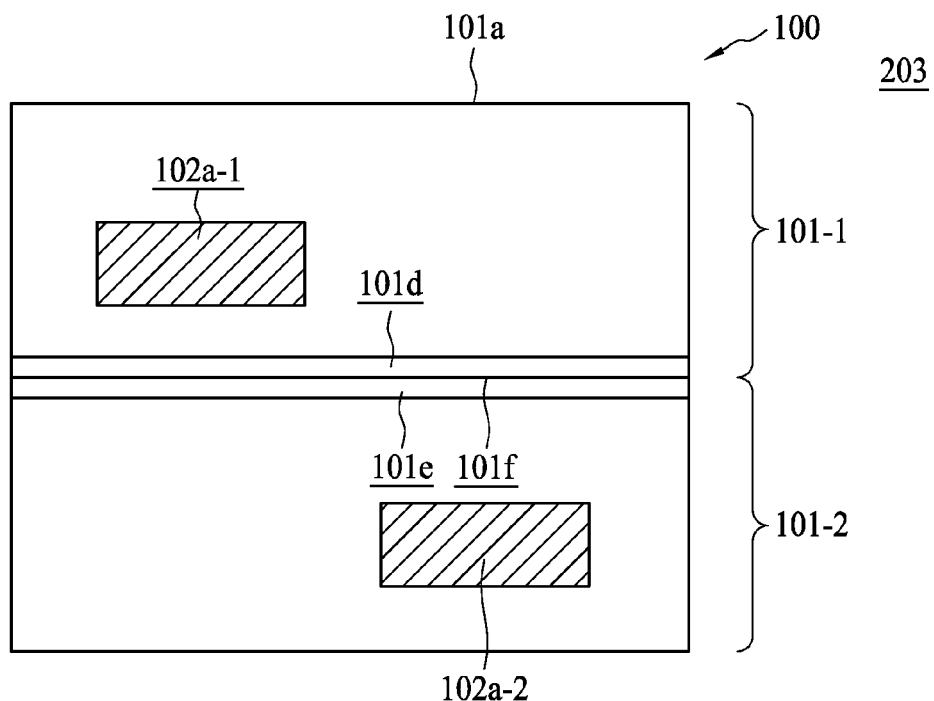
FIG. 3C is a schematic view of bonding a first semiconductor chip with a second semiconductor chip in accordance with some embodiments of the present disclosure.

In operation 203, the first semiconductor chip 101-1 is bonded with the second semiconductor chip 101-2 as in FIG. 3C. In some embodiments, the first semiconductor chip 101-1 and the second semiconductor chip 101-2 are bonded together through any suitable bonding techniques such as direct bonding. In some embodiments, the first semiconductor chip 101-1 and the second semiconductor chip 101-2 are bonded by the interface 101f between the passivation layer 101d of the first semiconductor chip 101-1 and the passivation layer 101e of the second semiconductor chip 101-2. In some embodiments, the first semiconductor chip 101-1 is bonded with the second semiconductor chip 101-2 through a suitable metal-dielectric bonding technique such as a copper-silicon oxide nitride (Cu—SiON) bonding process.

Figure 3D:
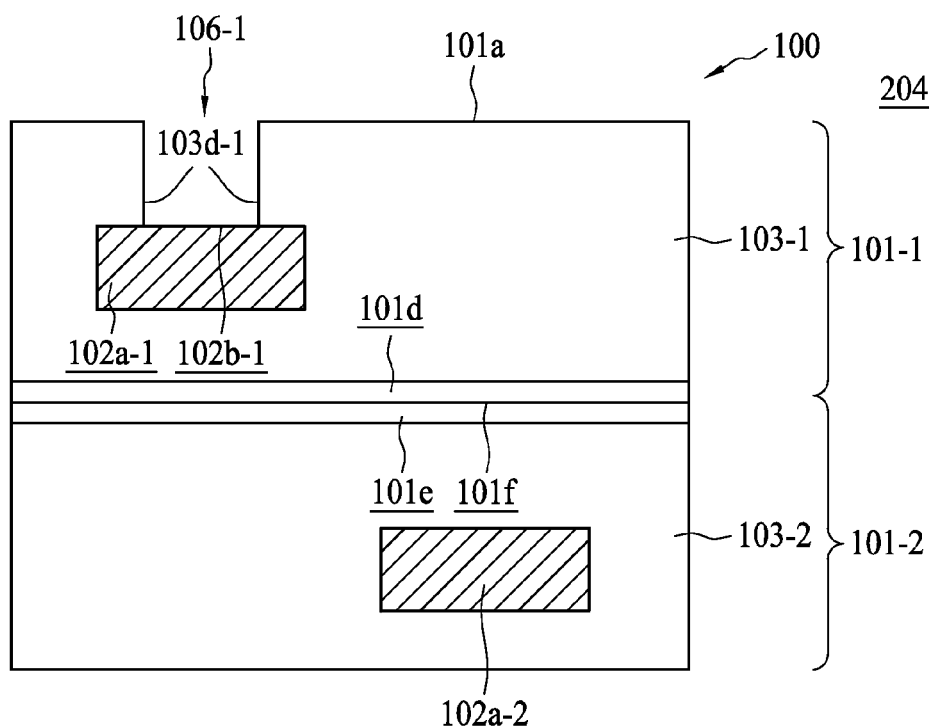
FIG. 3D is a schematic view of forming a first recessed portion in accordance with some embodiments of the present disclosure.

In operation 204, a first recessed portion 106-1 is formed as in FIG. 3D. The first recessed portion 106-1 is formed from the top surface 101a of the first semiconductor chip 101-1 towards the first metallic structure 102a-1, so that a portion 102b-1 of the first metallic structure 102a-1 is exposed. The first recessed portion 106-1 includes the first sidewall 103d-1 and a bottom surface coplanar with the portion 102b-1 of the first metallic structure 102a-1. The first recessed portion 106-1 is surrounded by the first insulating layer 103-1. In some embodiments, the bottom surface of the first recessed portion 106-1 is disposed on or within the first metallic structure 102a-1.

In some embodiments, the first recessed portion 106-1 is formed by etching of the first insulating layer 103-1. The etching is an operation of selectively dissolving and removing one or more kinds of materials by a predetermined etchant such as CF4. Some of the first insulating layer 103-1 are prevented from etching by a masking material such as a photolithography patterned-photoresist to form the first recessed portion 106-1. The first recessed portion 106-1 is formed depending on how long time of the etching operations and which types of etchants are used. In some embodiments, the etch rate of silicon dioxide is 3 um/min, that is a thickness of 3 um of the silicon dioxide is etched away every minute. In some embodiments, the first recessed portion 106-1 is formed by suitable deposition and photolithography techniques such as a reactive ion etch (RIE) or other dry etch, an anisotropic wet etch, any other suitable anisotropic etching or etc.

Figure 3E:
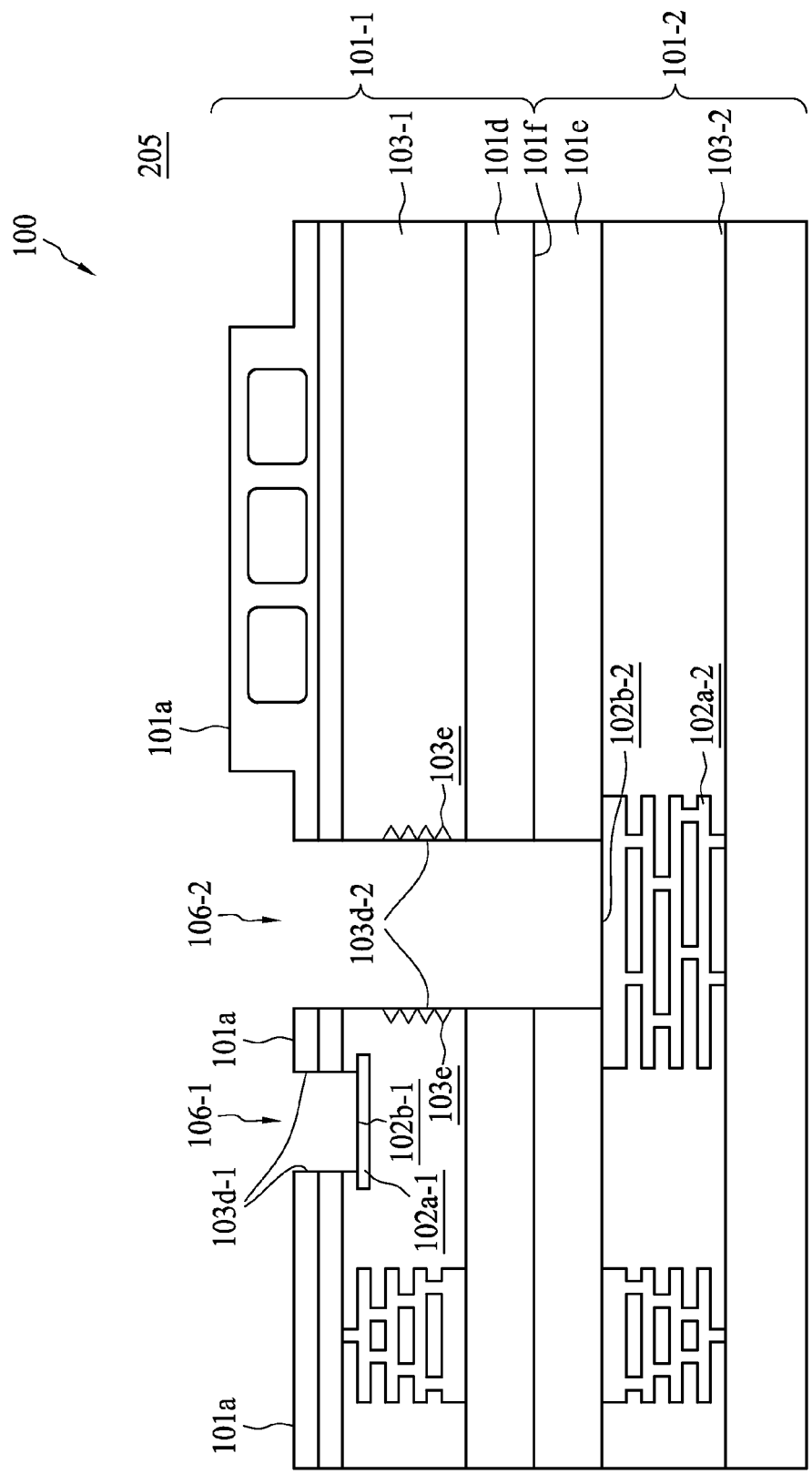
FIG. 3E is a schematic view of forming a second recessed portion in accordance with some embodiments of the present disclosure.

In operation 205, a second recessed portion 106-2 is formed as in FIG. 3E. In some embodiments, the second recessed portion 106-2 is formed from the top surface 101a to a portion 102b-2 of the second metallic structure 102a-2. The second recessed portion 106-2 passes from the first semiconductor chip 101-1 to the second semiconductor chip 101-2. In some embodiments, the second recessed portion 106-2 includes the second sidewall 103d-2 and a bottom surface coplanar with the portion 102b-2 of the second metallic structure 102a-2. In some embodiments, the bottom surface of the second recessed portion 106-2 is disposed on or within the second metallic structure 102a-2. In some embodiments, the second recessed portion 106-2 is surrounded by the first insulating layer 103-1. The second recessed portion 106-2 is extended from the top surface 101a of the first semiconductor chip 101-1 towards the second metallic structure 102a-2 of the second semiconductor chip 101-2, so that the portion 102b-2 of the second metallic structure 102a-2 is exposed.

In some embodiments, the second recessed portion 106-2 is formed by etching of the first insulating layer 103-1. Upon the etching operations, a number of staggered portions 103e are formed on the second sidewall 103d-2 of the second recessed portion 106-2 surrounded by the first insulating layer 103-1, because the first insulating layer 103-1 includes various kinds of materials with different etch rates to a predetermined etchant. As such, the sidewall 103d-1 is in an uneven and rough surface along the second recessed portion 106-2 towards the second metallic structure 102a-2.

Figure 3F:
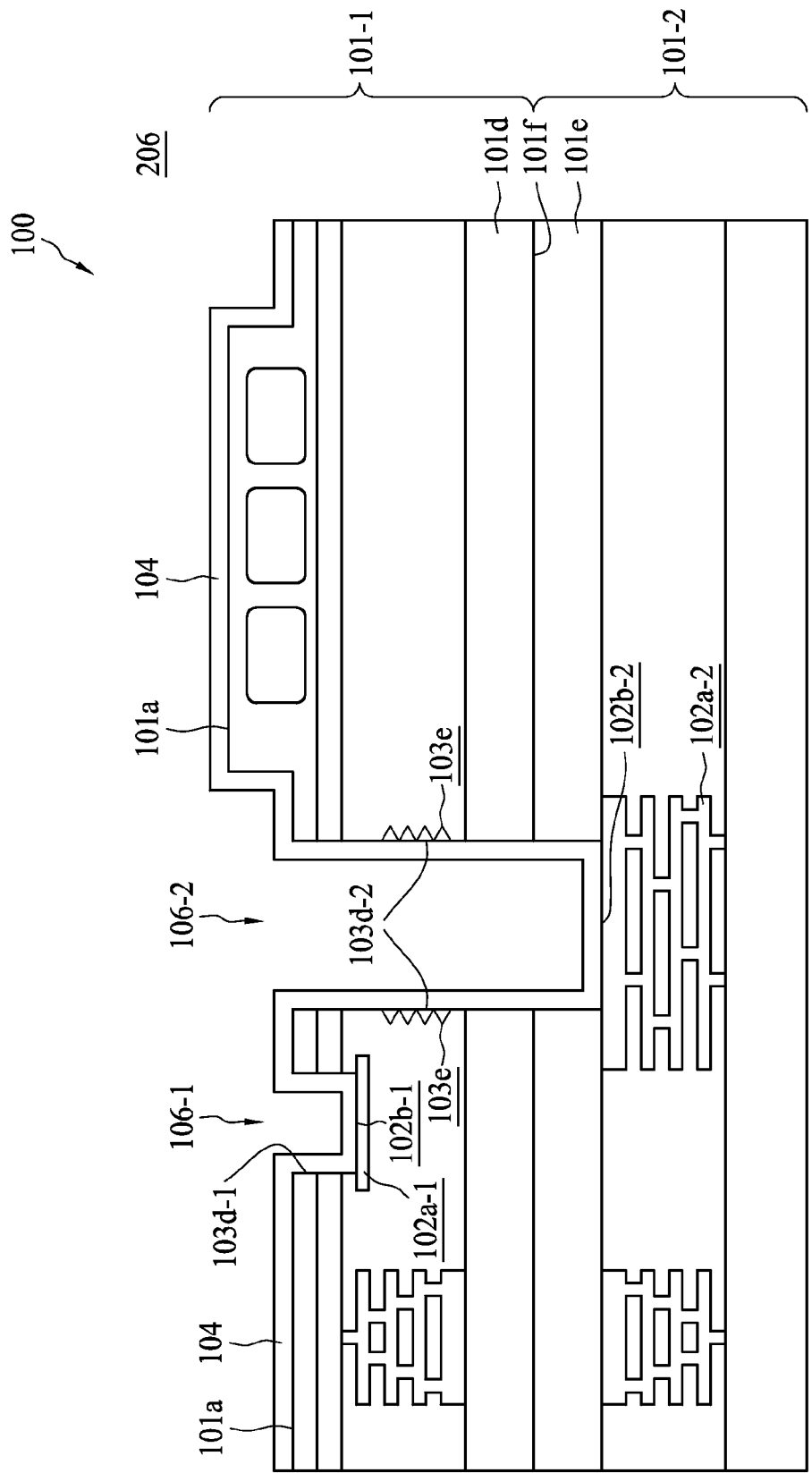
FIG. 3F is a schematic view of forming a dielectric layer in accordance with some embodiments of the present disclosure.

In operation 206, a dielectric layer 104 is formed as in FIG. 3F. In some embodiments, the dielectric layer 104 is coated on the top surface 101a of the first semiconductor chip 101-1, the first sidewall 103d-1 of the first recessed portion 106-1, the second sidewall 103d-2 of the second recessed portion 106-2, the portion 102b-1 of the first metallic structure 102a-1 and the portion 102b-2 of the second metallic structure 102a-2. In some embodiments, the dielectric layer 104 is a coating including non-conductive material such as silicon dioxide. In some embodiments, the dielectric layer 104 covers and fills the staggered portions 103e in order to smoothen the rough surface of the second sidewall 103d-2 of the second recessed portion 106-2.

Figure 3G:
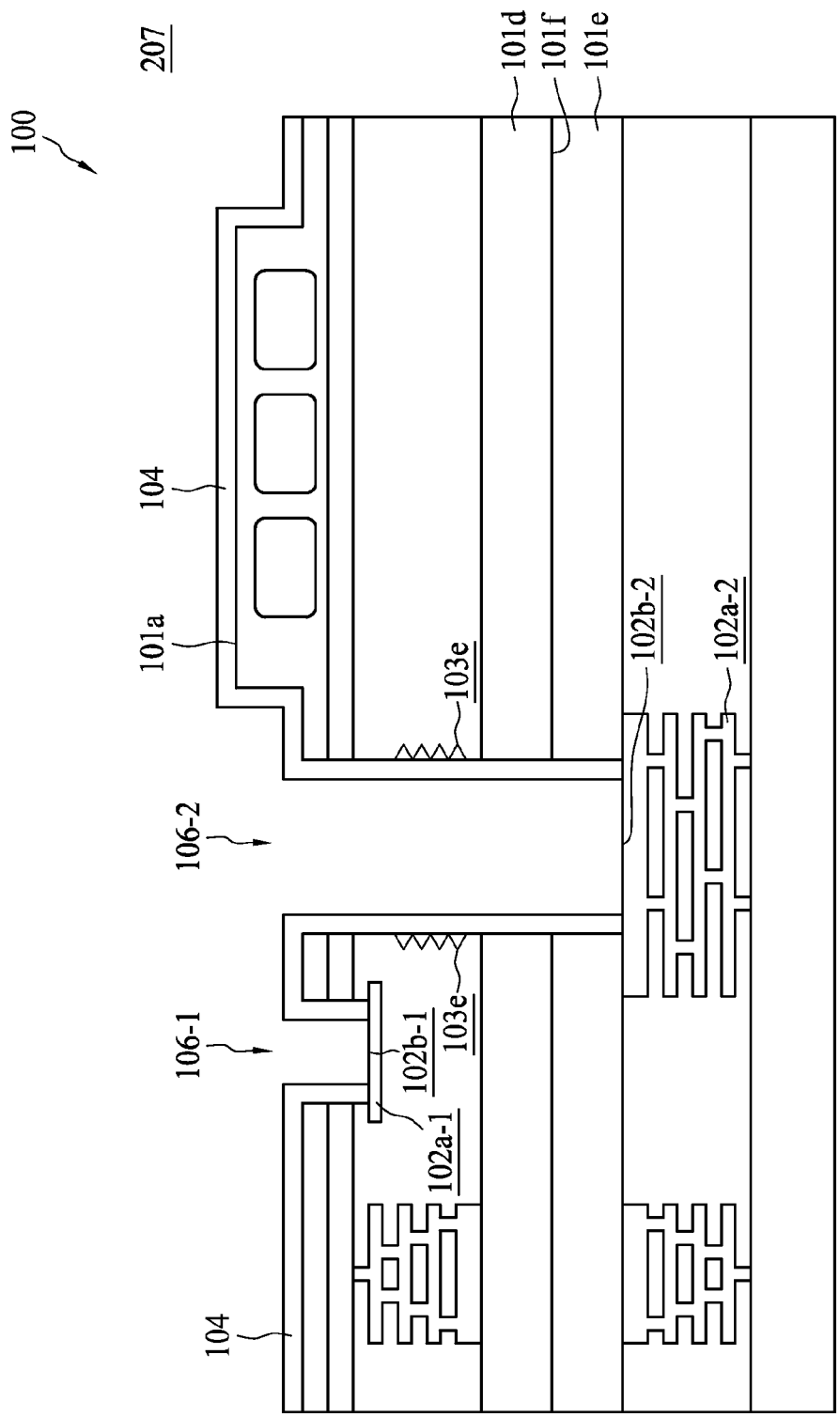
FIG. 3G is a schematic view of removing a portion of a dielectric layer in accordance with some embodiments of the present disclosure.

In operation 207, some portions of the dielectric layer 104 on the portion 102b-1 of the first metallic structure 101-1 and the portion 102b-2 of the second metallic structure 101-2 are removed as in FIG. 3G. As some portions of the dielectric layer 104 are not covered by the patterned photoresist, those uncovered portions of the dielectric layer 104 are dissolved and removed by etching by a predetermined etchant, and thus the portion 102b-1 of the first metallic structure 102a-1 and the portion 102b-2 of the second metallic structure 102a-2 are then exposed.

Figure 3H:
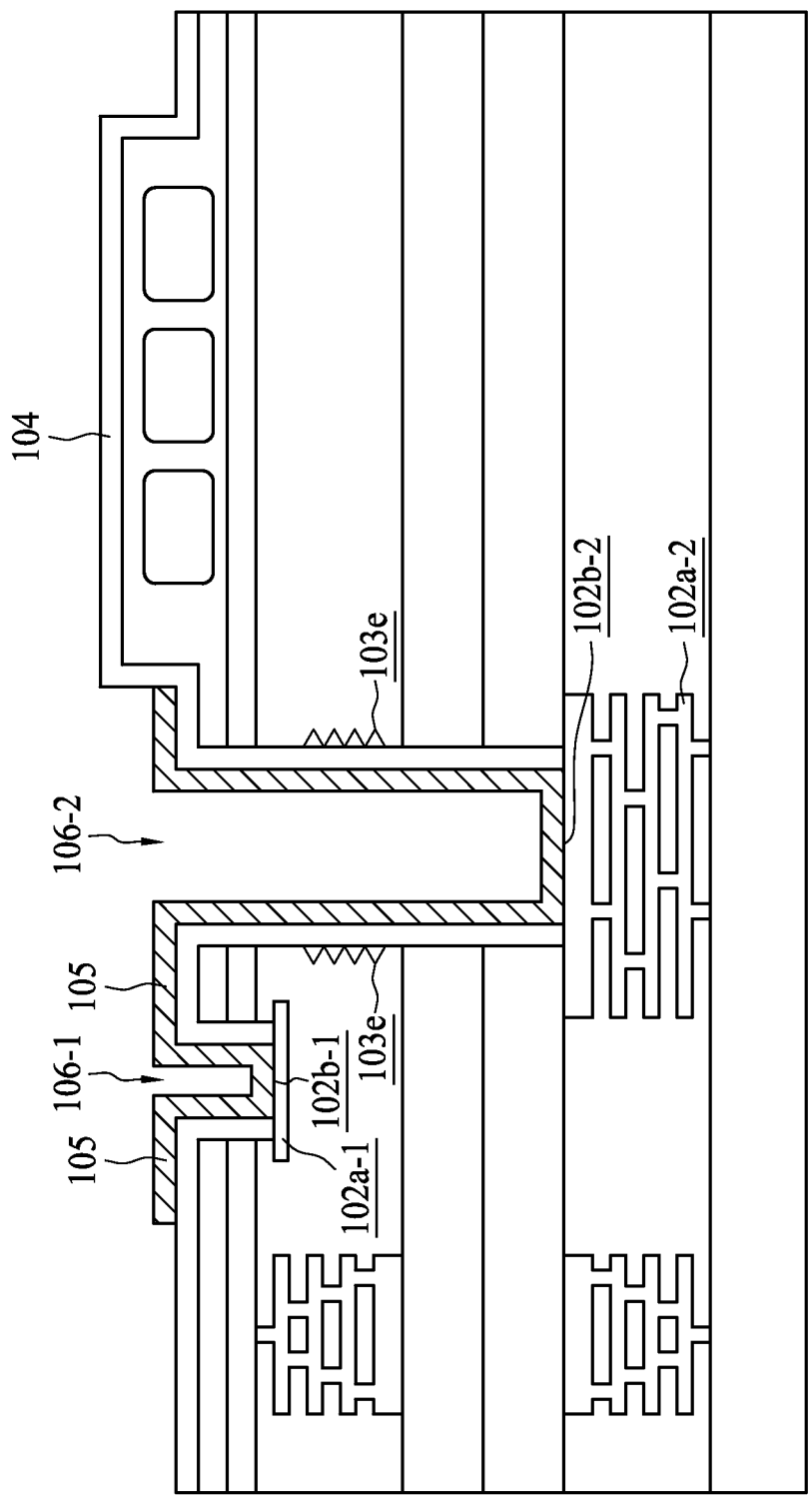
FIG. 3H is a schematic view of forming a conductive material in accordance with some embodiments of the present disclosure.

In operation 208, a conductive material 105 is formed on the dielectric layer 104, the portion 102b-1 of the first metallic structure 102a-1 and the portion 102b-2 of the second metallic structure 102a-2 as in FIG. 3H. In some embodiments, the conductive material 105 is formed by electroplating or sputtering. The first metallic structure 102a-1 is then electrically connected with the second metallic structure 102a-2 via the conductive material 105 passing from the top surface 101a, the first recessed portion 106-1 to the second recessed portion 106-2. In some embodiments, the conductive material 105 includes gold, silver, copper, nickel, tungsten, aluminum, palladium and/or alloys thereof.

Figure 4:
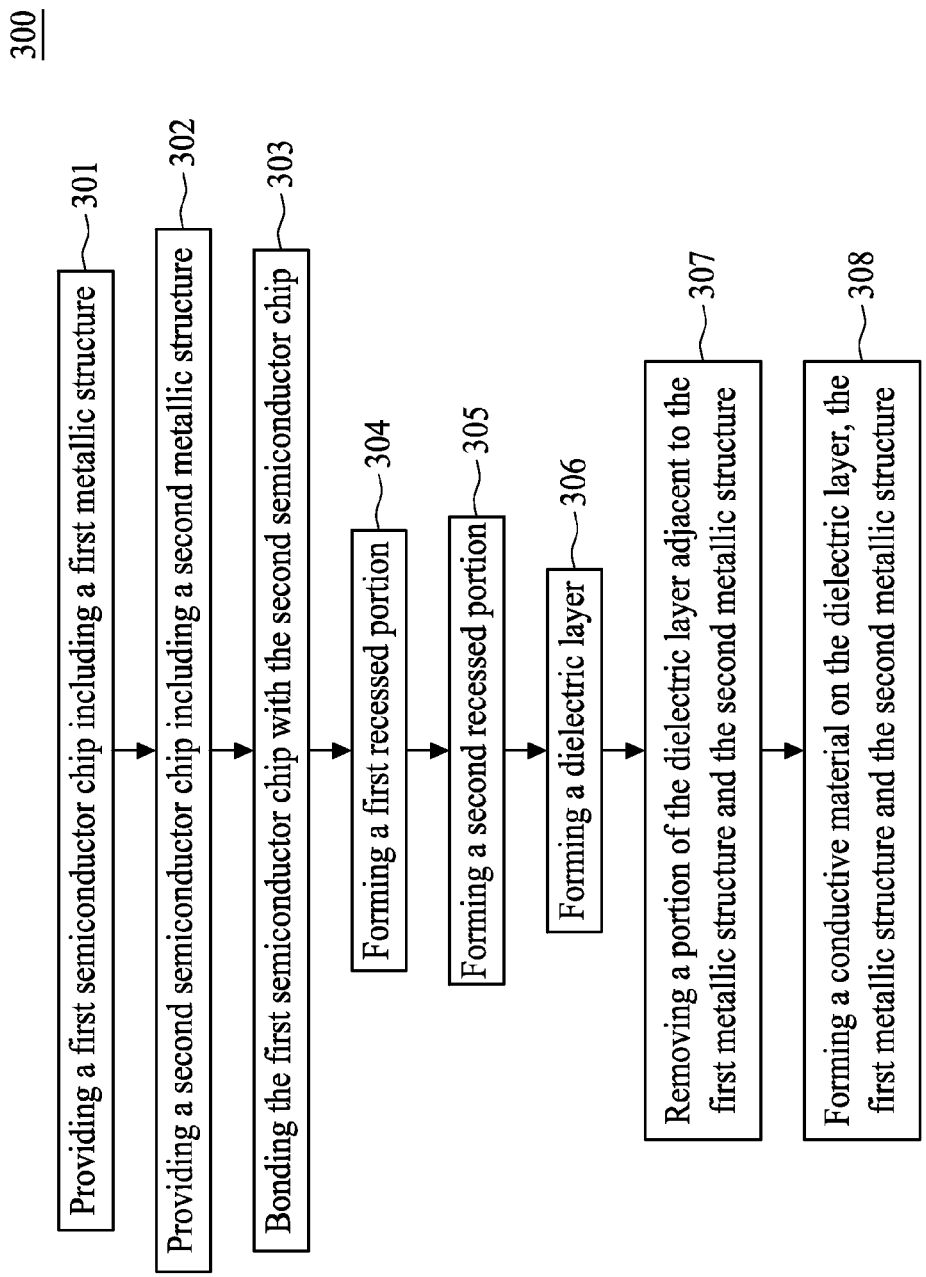
FIG. 4 is a flow diagram of a method of manufacturing a semiconductor device in accordance with some embodiments of the present disclosure.
Figure 4C:
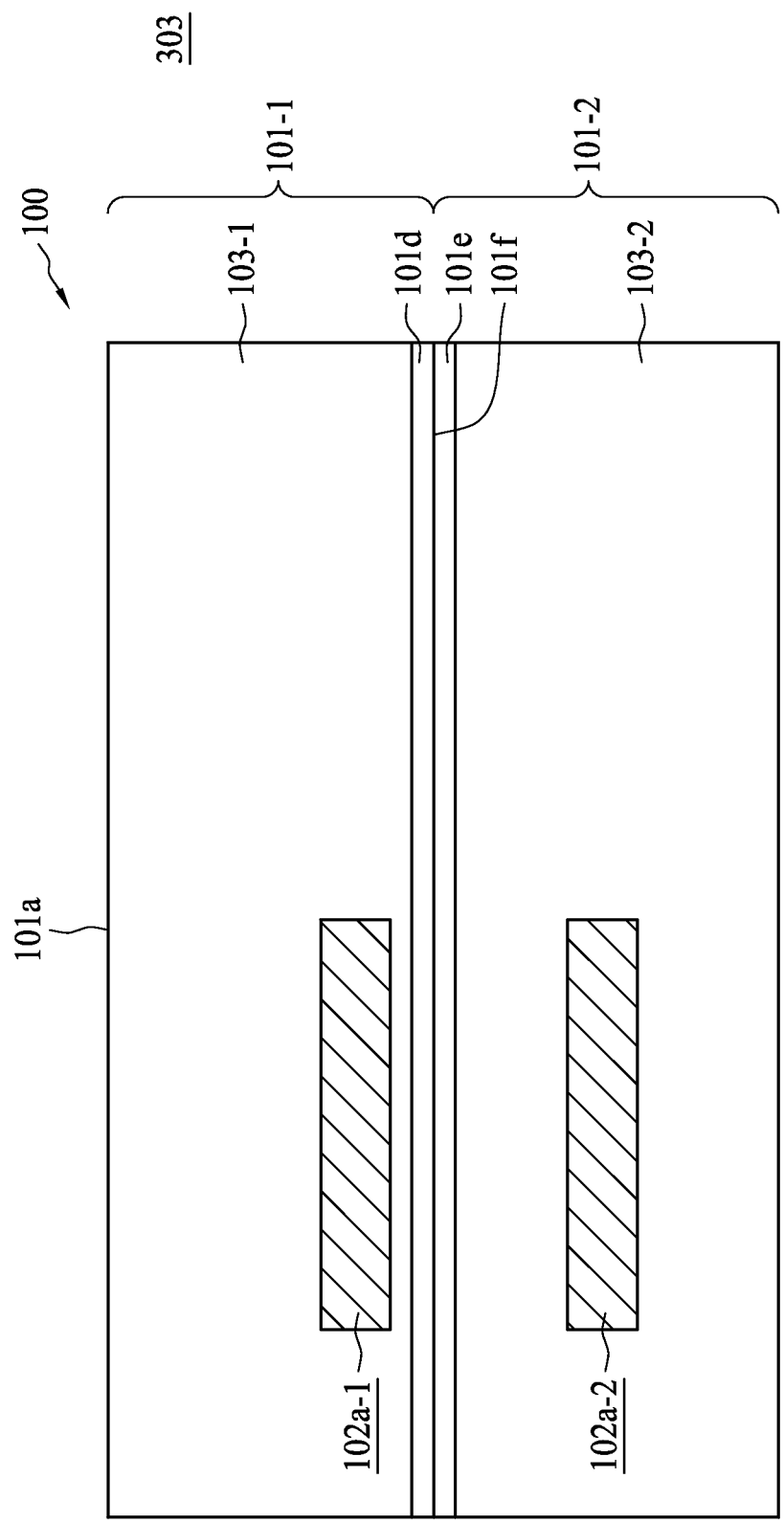
FIG. 4C is a schematic view of bonding a first semiconductor chip with a second semiconductor chip in accordance with some embodiments of the present disclosure.

FIG. 4 is an embodiment of a method 300 of manufacturing a semiconductor device. The method 300 includes a number of operations (301, 302, 303, 304, 305, 306, 307 and 308). In some embodiments, operations 201-203 in FIG. 3A-3C are similar to operations 301-303 in FIG. 4A-4C.

Figure 4D:
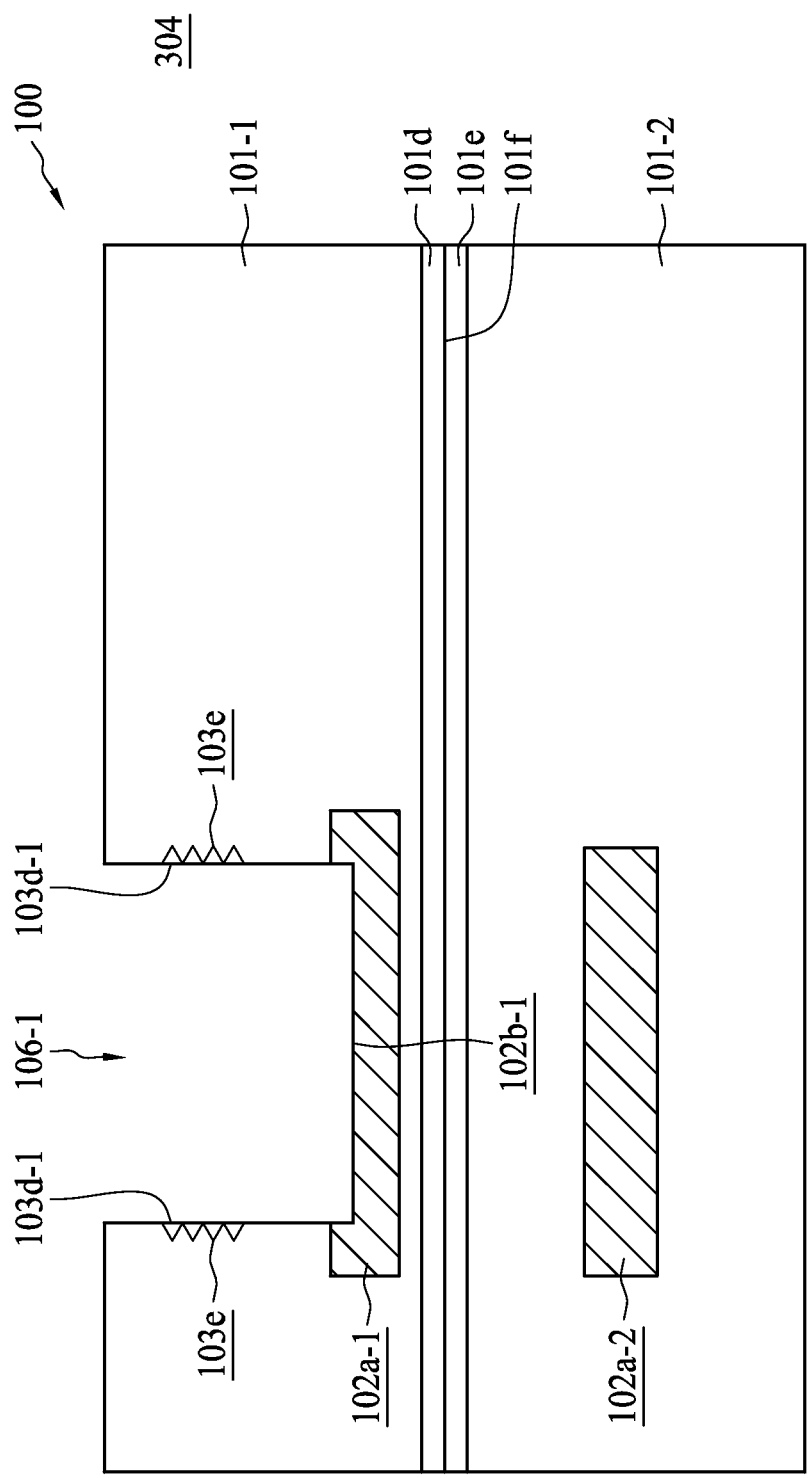
FIG. 4D is a schematic view of forming a first recessed portion in accordance with some embodiments of the present disclosure.

In operation 304, a first recessed portion 106-1 is formed as in FIG. 4D. The first recessed portion 106-1 is formed from the top surface 101a of the first semiconductor chip 101-1 towards the first metallic structure 102a-1, so that a portion 102b-1 of the first metallic structure 102a-1 is exposed. In some embodiments, the first recessed portion 106-1 includes the first sidewall 103d-1 and a bottom surface coplanar with the portion 102b-1 of the first metallic structure 102a-1. In some embodiments, the bottom surface of the first recessed portion 106-1 is disposed on or within the first metallic structure 102a-1. In some embodiments, the first recessed portion 106-1 is surrounded by the first insulating layer 103-1.

In some embodiments, the first recessed portion 106-1 is formed by etching of the first insulating layer 103-1. The etching is an operation of selectively dissolving and removing one or more kinds of materials by a predetermined etchant. Some of the first insulating layer 103-1 are prevented from etching by a masking material such as a photolithography patterned-photoresist to form the first recessed portion 106-1. The first recessed portion 106-1 is formed depending on how long time of the etching operations and which types of etchants are used. In some embodiments, the first recessed portion 106-1 is formed by suitable deposition and photolithography techniques such as a reactive ion etch (RIE) or other dry etch, an anisotropic wet etch, any other suitable anisotropic etching or etc.

In some embodiments, a number of staggered portions 103e are formed on the first sidewall 103d-1 of the first recessed portion 106-1 surrounded by the first insulating layer 103-1 upon the etching operations, because the first insulating layer 103-1 includes various kinds of materials with different etch rates to a predetermined etchant. As such, the first sidewall 103d-1 is in an uneven and rough surface along the first recessed portion 106-1.

Figure 4E:
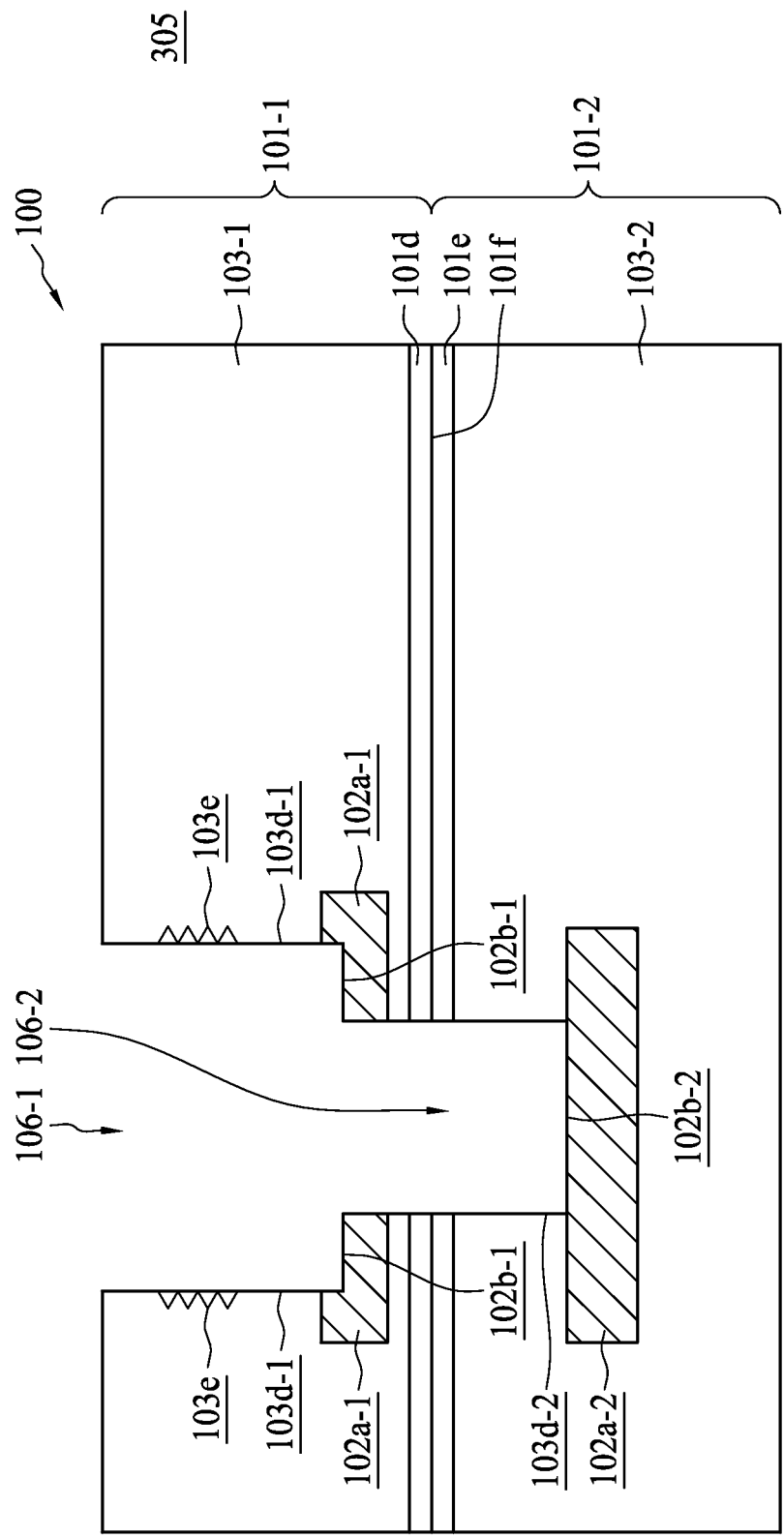
FIG. 4E is a schematic view of forming a second recessed portion in accordance with some embodiments of the present disclosure.

In operation 305, a second recessed portion 106-2 is formed as in FIG. 4E. In some embodiments, the second recessed portion 106-2 is formed from the portion 102b-1 of the first metallic structure 102a-1 to a portion 102b-2 of the second metallic structure 102a-2, so that the portion 102b-2 is exposed. In some embodiments, the second recessed portion 106-2 is formed by etching of the first insulating layer 103-1 and the second insulating layer 103-2. The second recessed portion 106-2 passes from the first semiconductor chip 101-1 to the second semiconductor chip 101-2. The second recessed portion 106-2 is extended from the bottom surface of the first recessed portion 106-1 towards the second metallic structure 102a-2.

In some embodiments, the second recessed portion 106-2 includes the second sidewall 103d-2 and a bottom surface coplanar with the portion 102b-2 of the second metallic structure 102a-2. In some embodiments, the bottom surface of the second recessed portion 106-2 is disposed on or within the second metallic structure 102a-2. In some embodiments, the first recessed portion 106-1 is coupled within the second recessed portion 106-2. In some embodiments, the first recessed portion 106-1 is disposed above the second recessed portion 106-2. In some embodiments, the second recessed portion 106-2 is surrounded by the first insulating layer 103-1 and the second insulating layer 103-2.

Figure 4F:
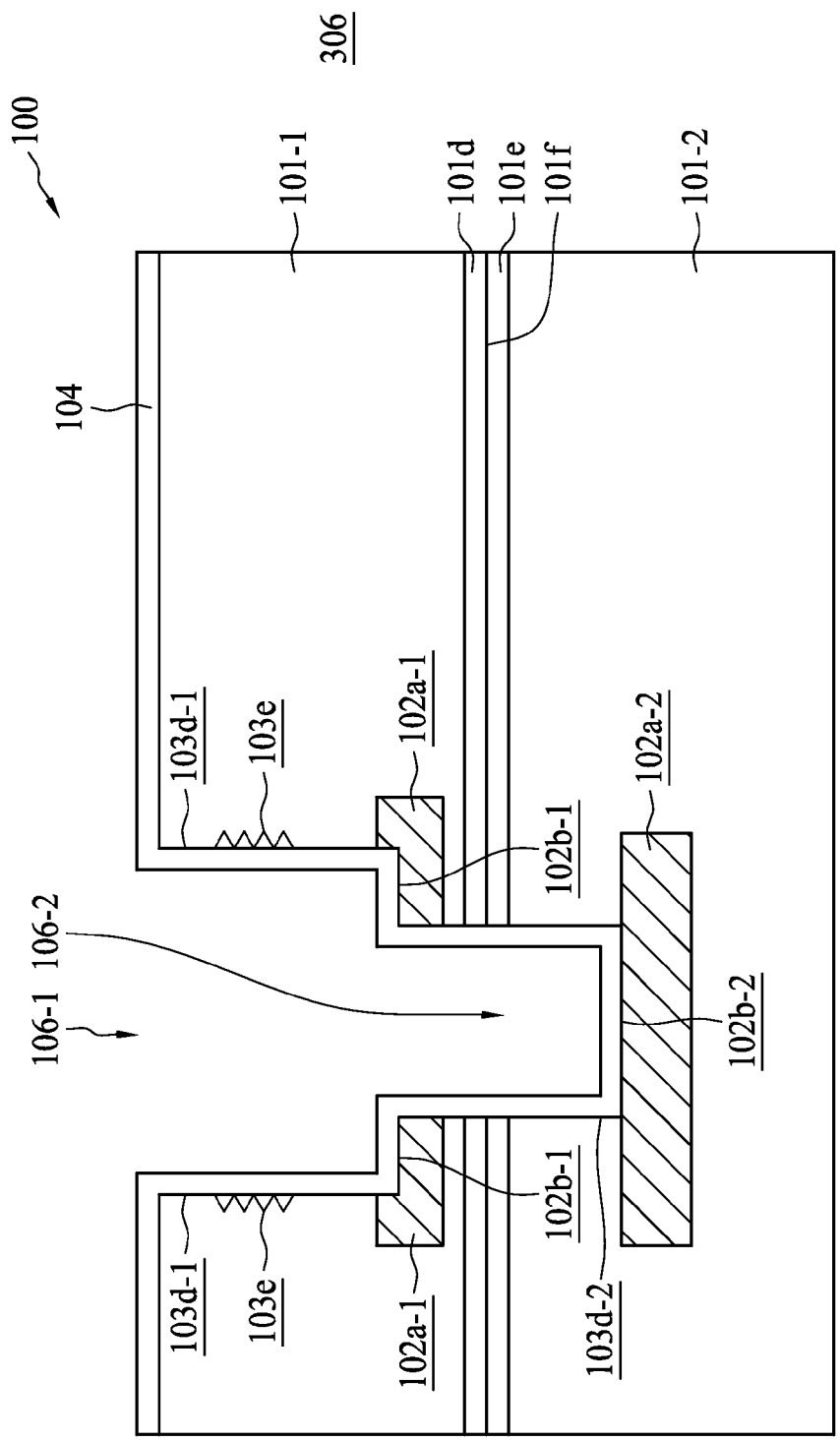
FIG. 4F is a schematic view of forming a dielectric layer in accordance with some embodiments of the present disclosure.

In operation 306, a dielectric layer 104 is formed as in FIG. 4F. In some embodiments, the dielectric layer 104 is coated on the top surface 101a of the first semiconductor chip 101-1, the first sidewall 103d-1 of the first recessed portion 106-1, the second sidewall 103d-2 of the second recessed portion 106-1, the portion 102b-1 of the first metallic structure 102a-1 and the portion 102b-2 of the second metallic structure 102a-2. In some embodiments, the dielectric layer 104 is a coating including non-conductive material such as silicon dioxide. In some embodiments, the dielectric layer 104 covers and fills the staggered portions 103e in order to smoothen the rough surface of the first sidewall 103d-1 of the first recessed portion 106-1.

Figure 4G:
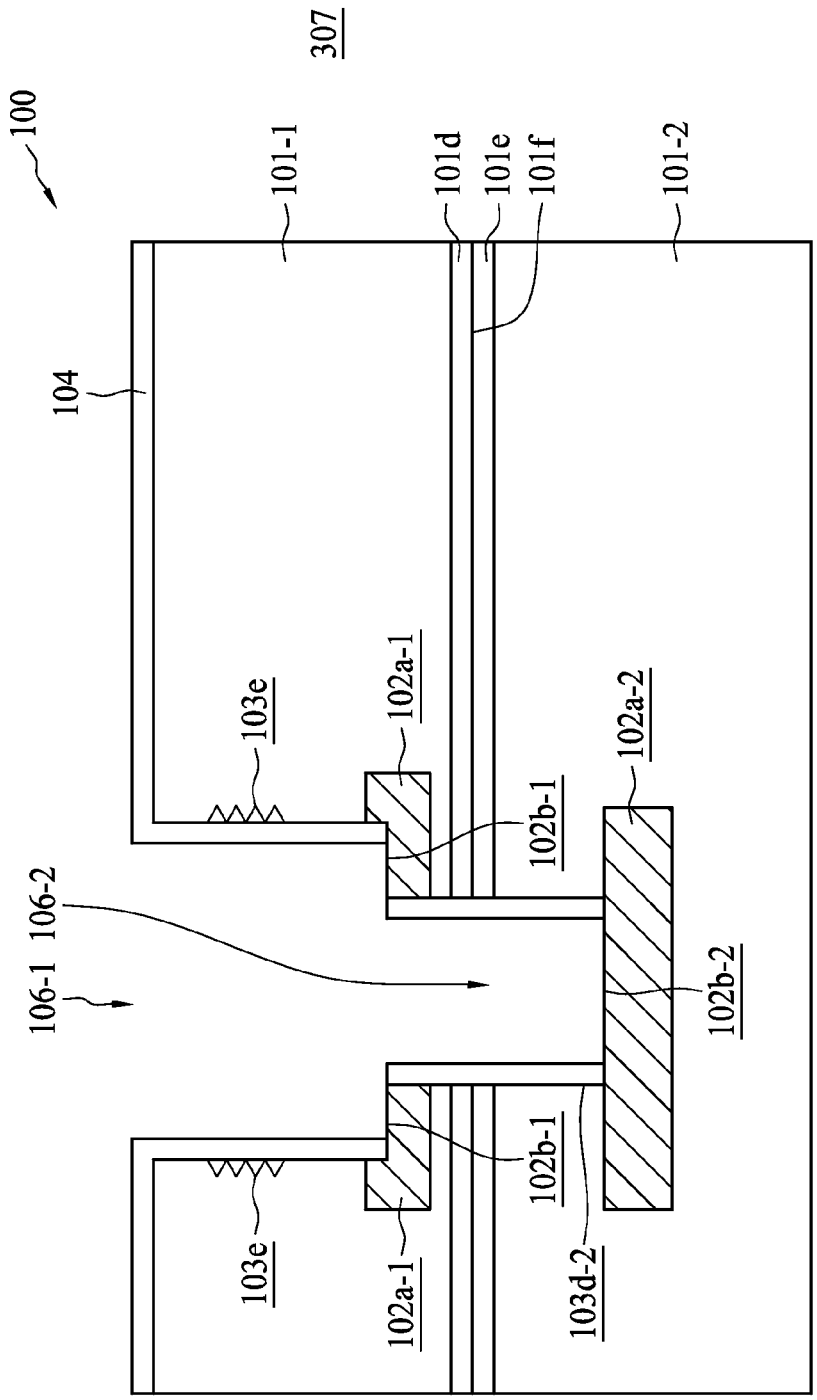
FIG. 4G is a schematic view of removing a portion of a dielectric layer in accordance with some embodiments of the present disclosure.

In operation 307, some portions of the dielectric layer 104 on the portion 102b-1 of the first metallic structure 101-1 and the portion 102b-2 of the second metallic structure 101-2 are removed as in FIG. 4G. In some embodiments, some portions of the dielectric layer 104 are dissolved and removed by etching, so that the portion 102b-1 of the first metallic structure 102a-1 and the portion 102b-2 of the second metallic structure 102a-2 are then exposed.

Figure 4H:
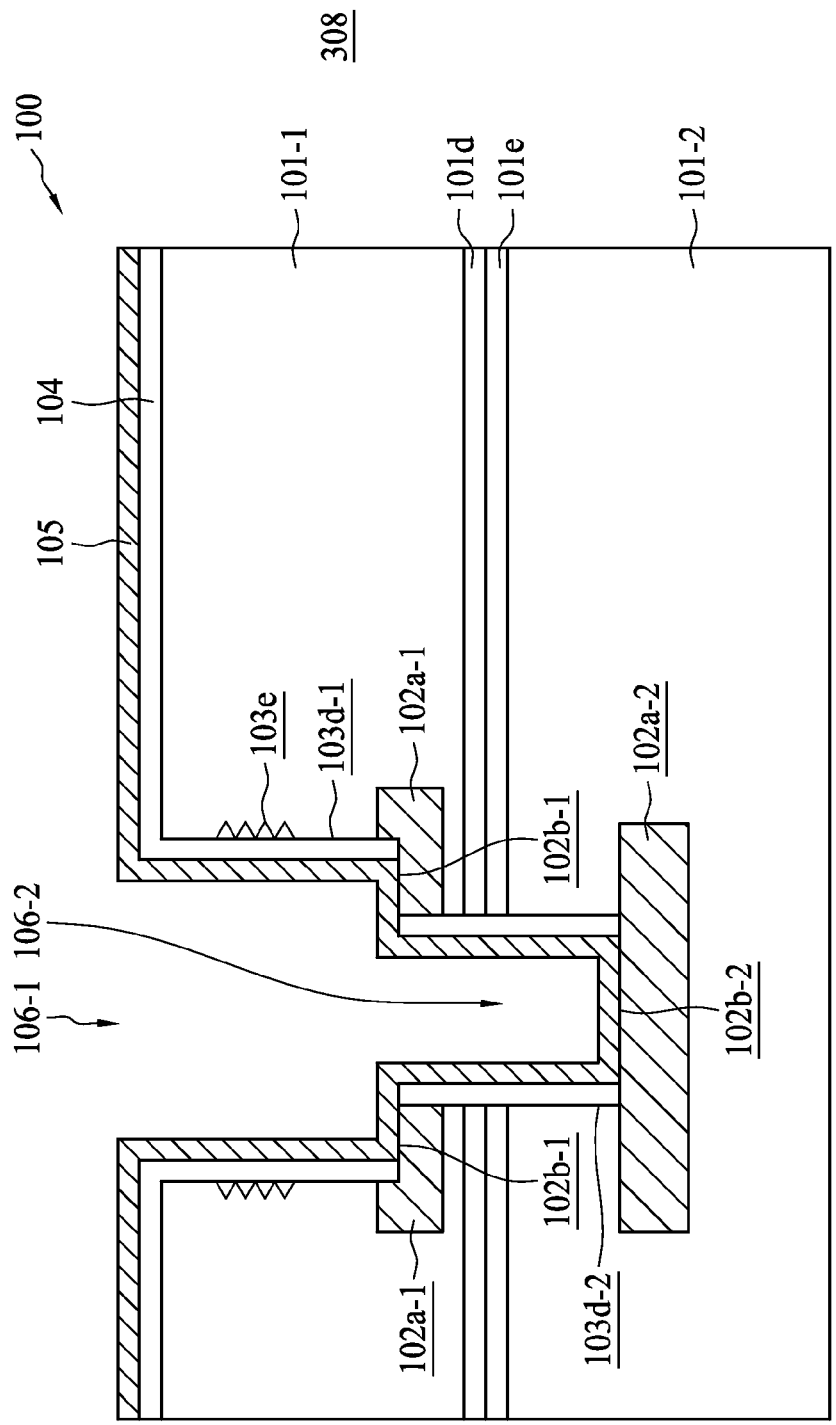
FIG. 4H is a schematic view of forming a conductive material in accordance with some embodiments of the present disclosure.

In operation 308, a conductive material 105 is formed on the dielectric layer 104, the portion 102b-1 of the first metallic structure 102a-1 and the portion 102b-2 of the second metallic structure 102a-2 as in FIG. 4H. In some embodiments, the conductive material 105 is formed by electroplating or sputtering. The first metallic structure 102a-1 is then electrically connected with the second metallic structure 102a-2 via the conductive material 105 passing from the top surface 101a, the first recessed portion 106-1 to the second recessed portion 106-2. In some embodiments, the conductive material 105 includes gold, silver, copper, nickel, tungsten, aluminum, palladium and/or alloys thereof.

In some embodiments, a semiconductor device includes a first semiconductor chip comprising a first metallic structure, a first surface, a second surface opposite to the first surface, and a first insulating layer including at least two adjacent layers differing in etch rate to a predetermined etchant; a second semiconductor chip comprising a second metallic structure and bonded with the first semiconductor chip on the second surface; a first recessed portion extended from the first surface of the first semiconductor chip to the first metallic structure, wherein the first recessed portion includes a first sidewall and a bottom surface disposed on or within the first metallic structure; a second recessed portion extended to the second metallic structure, wherein the second recessed portion includes a second sidewall and a bottom surface disposed on or within the second metallic structure; a dielectric layer disposed on the first sidewall of the first recessed portion and the second sidewall of the second recessed portion; and a conductive material disposed on the first surface, the dielectric layer, a portion of the first metallic structure interfaced with the bottom surface of the first recessed portion and a portion of the second metallic structure interfaced with the bottom surface of the second recessed portion, the first metallic structure being electrically connected with the second metallic structure.

In some embodiments, the at least two adjacent layers surround a portion of the first sidewall or a portion of the second sidewall. In some embodiments, the second recessed portion is extended from the first surface or from the first metallic structure. In some embodiments, the first recessed portion is coupled with the second recessed portion. In some embodiments, the first recessed portion is disposed above the second recessed portion. In some embodiments, the first sidewall or the second sidewall includes a staggered portion covered by the dielectric layer. In some embodiments, one of the at least two adjacent layers is recessed laterally relative to another with a depth. In some embodiments, the at least two adjacent layers include silicon carbide and black diamond. In some embodiments, a thickness of the conductive material is about 4 kA to 12 kA. In some embodiments, the conductive material includes gold, silver, copper, nickel, tungsten, aluminum, palladium and/or alloys thereof. In some embodiments, the first recessed portion and the second recessed portion are in a stepped configuration.

In some embodiments, a semiconductor device includes a first semiconductor chip comprising a first metallic structure, a top surface, and a bottom surface; a second semiconductor chip comprising a second metallic structure, wherein the second semiconductor chip is bonded with the first semiconductor chip on the bottom surface; a conductive material connecting the first metallic structure and the second metallic structure, wherein a portion of the conductive material is inside the first semiconductor chip and the second semiconductor chip; and a dielectric layer surrounding the portion of the conductive material.

In some embodiments, the dielectric layer is disposed on a sidewall of a first recessed portion extended from the top surface to the first metallic structure or a sidewall of a second recessed portion extended from the top surface to the second metallic structure. In some embodiments, the first semiconductor chip is a semiconductor image sensor chip and the second semiconductor chip is a semiconductor ASIC chip. In some embodiments, the bottom surface interfaced with the first semiconductor chip and the second semiconductor chip is surrounded by a passivation.

In some embodiments, a method of manufacturing a semiconductor device includes providing a first semiconductor chip comprising a first metallic structure and a first surface and a second surface opposite to the first surface; providing a second semiconductor chip comprising a second metallic structure; bonding the first semiconductor chip with the second semiconductor chip on the second surface; forming a first recessed portion including a first sidewall and a first bottom surface coplanar with a top surface of the first metallic structure; forming a second recessed portion including a second sidewall and a second bottom surface coplanar with a top surface of the second metallic structure; forming a dielectric layer on the first sidewall and the second sidewall; and forming a conductive material on the dielectric layer, the top surface of the first metallic structure and the top surface of the second metallic structure to electrically connect the first metallic structure and the second metallic structure.

In some embodiments, the method further includes removing the dielectric layer on the top surface of the first metallic structure and the top surface of the second metallic structure by etching. In some embodiments, the first recessed portion or the second recessed portion is formed by etching. In some embodiments, the first recessed portion extends from the first surface, and the second recessed portion extends from the first surface or the top surface of the first metallic structure. In some embodiments, the dielectric layer disposed on the first sidewall is thicker than the dielectric layer disposed on the first metallic structure.

The methods and features of this disclosure have been sufficiently described in the above examples and descriptions. It should be understood that any modifications or changes without departing from the spirit of the disclosure are intended to be covered in the protection scope of the disclosure.

Moreover, the scope of the present application in not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein maybe utilized according to the present disclosure.

Accordingly, the appended claims are intended to include within their scope such as processes, machines, manufacture, compositions of matter, means, methods or steps. In addition, each claim constitutes a separate embodiment, and the combination of various claims and embodiments are within the scope of the disclosure.

What is claimed is:

1. A semiconductor device, comprising:
    a first semiconductor chip comprising a first metallic structure, a first surface, a second surface opposite to the first surface, and a first insulating layer including at least two adjacent layers differing in etch rate to a predetermined etchant;
    a second semiconductor chip comprising a second metallic structure and bonded with the first semiconductor chip on the second surface;
    a first recessed portion extended from the first surface of the first semiconductor chip to the first metallic structure, wherein the first recessed portion includes a first sidewall and a bottom surface disposed on or within the first metallic structure;
    a second recessed portion extended from the first surface to the second metallic structure, wherein the second recessed portion includes a second sidewall and a bottom surface disposed on or within the second metallic structure;
    a dielectric layer disposed on the first sidewall of the first recessed portion and the second sidewall of the second recessed portion; and
    a conductive material disposed DIRECTLY on the first surface, the dielectric layer, a portion of the first metallic structure interfaced with the bottom surface of the first recessed portion and a portion of the second metallic structure interfaced with the bottom surface of the second recessed portion, the first metallic structure being electrically connected with the second metallic structure,
    wherein the first sidewall or the second sidewall includes a staggered portion covered by the dielectric layer.

2. The semiconductor device of claim 1, wherein the at least two adjacent layers surround a portion of the first sidewall or a portion of the second sidewall.

3. The semiconductor device of claim 1, wherein the second recessed portion is extended from the first surface or from the first metallic structure.

4. The semiconductor device of claim 1, wherein the first recessed portion is coupled with the second recessed portion.

5. The semiconductor device of claim 1, wherein the first recessed portion is disposed above the second recessed portion.

6. The semiconductor device of claim 1, wherein one of the at least two adjacent layers is recessed laterally relative to another with a depth.

7. The semiconductor device of claim 1, wherein the at least two adjacent layers include silicon carbide and black diamond.

8. The semiconductor device of claim 1, wherein a thickness of the conductive material is about 4 kA to 12 kA.

9. The semiconductor device of claim 1, wherein the conductive material includes gold, silver, copper, nickel, tungsten, aluminum, palladium and/or alloys thereof.

10. The semiconductor of claim 1, wherein the first recessed portion and the second recessed portion are in a stepped configuration.

11. The semiconductor device of claim 1, wherein the second recessed portion passes through the first semiconductor chip and the second semiconductor chip.

12. The semiconductor device of claim 1, wherein the dielectric layer is disposed conformal to the first sidewall or the second sidewall.

13. The semiconductor device of claim 1, wherein the dielectric layer includes oxide.

14. The semiconductor device of claim 1, wherein the dielectric layer is disposed between the conductive material and the first insulating layer or the second insulating layer.

15. The semiconductor device of claim 1, wherein a portion of the dielectric layer is disposed within the staggered portion.

* * * * *